US011665950B2

(12) United States Patent
Yonemoto

(10) Patent No.: US 11,665,950 B2
(45) Date of Patent: May 30, 2023

(54) ELECTROLUMINESCENT DISPLAY DEVICE

(71) Applicant: FUJIFILM Corporation, Tokyo (JP)

(72) Inventor: Takashi Yonemoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 202 days.

(21) Appl. No.: 17/020,784

(22) Filed: Sep. 14, 2020

(65) Prior Publication Data

US 2020/0411609 A1 Dec. 31, 2020

Related U.S. Application Data

(63) Continuation of application No. PCT/JP2019/009932, filed on Mar. 12, 2019.

(30) Foreign Application Priority Data

Mar. 16, 2018 (JP) ............................ JP2018-050067

(51) Int. Cl.
*G02F 1/1335* (2006.01)
*H01L 27/32* (2006.01)
(Continued)

(52) U.S. Cl.
CPC ........ *H01L 27/3232* (2013.01); *G02B 5/3016* (2013.01); *G02F 1/133528* (2013.01); *H01L 27/156* (2013.01); *H01L 27/3216* (2013.01)

(58) Field of Classification Search
CPC ............. H01L 51/5281; H01L 27/3244; H01L 27/3232; G02F 1/133528–13355
See application file for complete search history.

(56) References Cited

U.S. PATENT DOCUMENTS 9,164,211 B2 10/2015 Yim et al.
9,196,873 B1 * 11/2015 Chang .................... H01L 33/10
(Continued)

FOREIGN PATENT DOCUMENTS

CN 102347450 2/2012
CN 103489891 1/2014
(Continued)

OTHER PUBLICATIONS

"International Search Report (Form PCT/ISA/210) of PCT/JP2019/009932," dated May 21, 2019, with English translation thereof, pp. 1-5.
(Continued)

*Primary Examiner* — Eric K Ashbahian
(74) *Attorney, Agent, or Firm* — JCIPRNET

(57) ABSTRACT

An object of the present invention is to provide a display device capable of achieving both an effect of preventing reflection of external light and improvement in utilization efficiency of light emitted from a light emitting element. An electroluminescent display device includes a substrate having a plurality of light emitting elements using electroluminescence, a λ/4 wavelength plate, and a polarizing plate including a patterned polarizing layer in this order, in which the patterned polarizing layer has a region A having a polarization degree of less than 80% and a region B having a polarization degree of 80% or more, and further, a position of the region A of the patterned polarizing layer corresponds to a position of the light emitting element of the electroluminescent substrate.

10 Claims, 9 Drawing Sheets

(51) Int. Cl.
*G02B 5/30* (2006.01)
*H01L 27/15* (2006.01)

(56) References Cited

U.S. PATENT DOCUMENTS

| | | | |
|---|---|---|---|
| 9,341,758 B2 | 5/2016 | Matsuda et al. | |
| 9,599,759 B2 | 3/2017 | Hatanaka | |
| 9,891,465 B2 * | 2/2018 | Chong | G02F 1/133528 |
| 10,644,078 B2 | 5/2020 | Miyahara et al. | |
| 10,809,433 B2 | 10/2020 | Murashige et al. | |
| 2007/0145889 A1 | 6/2007 | Tamura et al. | |
| 2012/0018712 A1 * | 1/2012 | Hamaguchi | H01L 27/3218 257/40 |
| 2014/0054576 A1 | 2/2014 | Hamaguchi et al. | |
| 2015/0048339 A1 | 2/2015 | Kinohira et al. | |
| 2015/0219816 A1 | 8/2015 | Kinohira et al. | |
| 2016/0252665 A1 * | 9/2016 | Lee | G02B 5/3083 359/489.07 |
| 2018/0331326 A1 * | 11/2018 | Woo | H01L 51/5275 |
| 2020/0183226 A1 * | 6/2020 | Wang | G02F 1/13471 |

FOREIGN PATENT DOCUMENTS

| | | | |
|---|---|---|---|
| CN | 103649792 | 3/2014 | |
| CN | 103675980 | 3/2014 | |
| CN | 104157646 | 11/2014 | |
| CN | 104169754 | 11/2014 | |
| CN | 105022111 | 11/2015 | |
| JP | 2007173084 | 7/2007 | |
| JP | 2009259721 | 11/2009 | |
| JP | 2009283246 | 12/2009 | |
| JP | 2012028064 | 2/2012 | |
| JP | 5288574 B2 * | 9/2013 | H01L 51/5281 |
| JP | 2017022016 | 1/2017 | |
| JP | 2017134414 | 8/2017 | |
| WO | 2011135799 | 11/2011 | |
| WO | 2013137113 | 9/2013 | |
| WO | WO-2013137113 A1 * | 9/2013 | G02B 5/3025 |
| WO | 2016035636 | 3/2016 | |
| WO | 2017038927 | 3/2017 | |

OTHER PUBLICATIONS

"Written Opinion of the International Searching Authority (Form PCT/ISA/237) of PCT/JP2019/009932," dated May 21, 2019, with English translation thereof, pp. 1-15.

Office Action of Japan Counterpart Application, with English translation thereof, dated Mar. 16, 2021, pp. 1-7.

"Office Action of China Counterpart Application", dated Dec. 20, 2022, with English translation thereof, pp. 1-11.

* cited by examiner

ELECTROLUMINESCENT DISPLAY DEVICE

CROSS-REFERENCE TO RELATED APPLICATIONS

This application is a Continuation of PCT International Application No. PCT/JP2019/009932 filed on Mar. 12, 2019, which claims priority under 35 U.S.C. § 119(a) to Japanese Patent Application No. 2018-050067 filed on Mar. 16, 2018. The above application is hereby expressly incorporated by reference, in its entirety, into the present application.

BACKGROUND OF THE INVENTION

1. Field of the Invention

The present invention relates to a display device using light emission using electroluminescence.

2. Description of the Related Art

In recent years, as a display device replacing a liquid crystal display device, a display device using a self-light emitting type light emitting element such as organic electroluminescence (organic EL) or inorganic EL (inorganic light emitting diode (LED)) has been developed.

Particularly, an image display device reflects external light in a bright environment, and thus the contrast is deteriorated.

Therefore, a self-light emitting type display device using a light emitting element such as an organic EL display device or an inorganic EL display device is provided with a circularly polarizing plate consisting of a polarizer and a λ/4 plate on the surface as an antireflection film.

For example, JP2009-259721A discloses an organic EL display device comprising an organic EL element unit consisting of a reflective electrode, an organic EL light emitting layer, and a transparent electrode, and a circularly polarizing plate consisting of a phase difference plate and a polarizing plate, in which an antireflection layer in which a reflectivity of a complementary color wavelength range of the color of light reflected by a surface of the circularly polarizing plate is high is provided on an air interface of a member provided closer to an observer than the circularly polarizing plate.

In addition, JP2017-022016A discloses a circularly polarizing plate for an organic EL display device comprising a polarizer, a phase difference layer functioning as a λ/4 plate, a barrier layer, and a pressure sensitive adhesive layer having a barrier function in this order, in which the barrier layer is a thin glass having a thickness of 5 to 100 μm, and an organic EL display device comprising the circularly polarizing plate.

SUMMARY OF THE INVENTION

Since such a self-light emitting type display device such as an inorganic EL display device or an organic EL display device has an antireflection film (circularly polarizing plate) consisting of a polarizer and a λ/4 plate, external light is prevented from being reflected and thus image display with high contrast can be realized.

However, on the other hand, the antireflection film consisting of the polarizer and the λ/4 plate also absorbs light emitted from the light emitting element. Therefore, a conventional self-light emitting type display device has low light utilization efficiency and cannot sufficiently exhibit the performance of light emitting elements such as LEDs.

An object of the present invention is to solve such problems in the conventional technique and to provide a display device capable of achieving both an effect of preventing reflection of external light and improvement in utilization efficiency of light emitted from a light emitting element in a self-light emitting type display device using an inorganic EL element, an organic EL element, or the like.

In order to achieve the object, an electroluminescent display device according to an aspect of the present invention has the following configurations.

[1] An electroluminescent display device comprising, in order: an electroluminescent substrate having a plurality of light emitting elements using electroluminescence; a 7.14 wavelength plate; and a polarizing plate including a patterned polarizing layer, in which the patterned polarizing layer has a region A having a polarization degree of less than 80% and a region B having a polarization degree of 80% or more, and further, a position of the region A of the patterned polarizing layer corresponds to a position of the light emitting element of the electroluminescent substrate.

[2] The electroluminescent display device according to [1], in which the region A of the patterned polarizing layer has a region having a polarization degree of 10% or less.

[3] The electroluminescent display device according to [1] or [2], in which a single transmittance of the region A of the patterned polarizing layer is 50% or more.

[4] The electroluminescent display device according to any one of [1] to [3], in which in a case where an area ratio of the region A on the patterned polarizing layer is SA and an area ratio of the light emitting elements on the electroluminescent substrate is SP, $0.5 \leq SA/SP$ and $SA<50\%$ are satisfied.

[5] The electroluminescent display device according to any one of [1] to [4], in which the area ratio of the light emitting elements in the electroluminescent substrate is 30% or less.

[6] The electroluminescent display device according to any one of [1] to [5], in which the patterned polarizing layer is formed using a liquid crystal compound.

[7] The electroluminescent display device according to any one of [1] to [6], in which a distance between the patterned polarizing layer and the light emitting elements on the electroluminescent substrate is shorter than a pitch of the light emitting elements on the electroluminescent substrate.

[8] The electroluminescent display device according to any one of [1] to [7], in which the patterned polarizing layer has at least one of the region A having a region with a high polarization degree in comparison with a region spaced from the region B on the region B side, or the region B having a region with a low polarization degree in comparison with a region spaced from the region A on the region A side.

[9] The electroluminescent display device according to [8], in which the patterned polarizing layer has at least one of the region A having a region in which a polarization degree gradually increases toward the region B on the region B side, or the region B having a region in which a polarization degree gradually decreases toward the region A on the region A side.

[10] The electroluminescent display device according to any one of [1] to [9], in which a total thickness of the polarizing plate and the λ/4 wavelength plate is 20 μm or less.

[11] The electroluminescent display device according to any one of [1] to [10], in which the light emitting element is an LED.

According to the aspect of the present invention, it is possible to achieve both an effect of preventing reflection of external light and improvement in utilization efficiency of light emitted from a light emitting element in a self-light emitting type display device using an inorganic EL element, an organic EL element, or the like.

DESCRIPTION OF THE PREFERRED EMBODIMENTS

Figure 1:
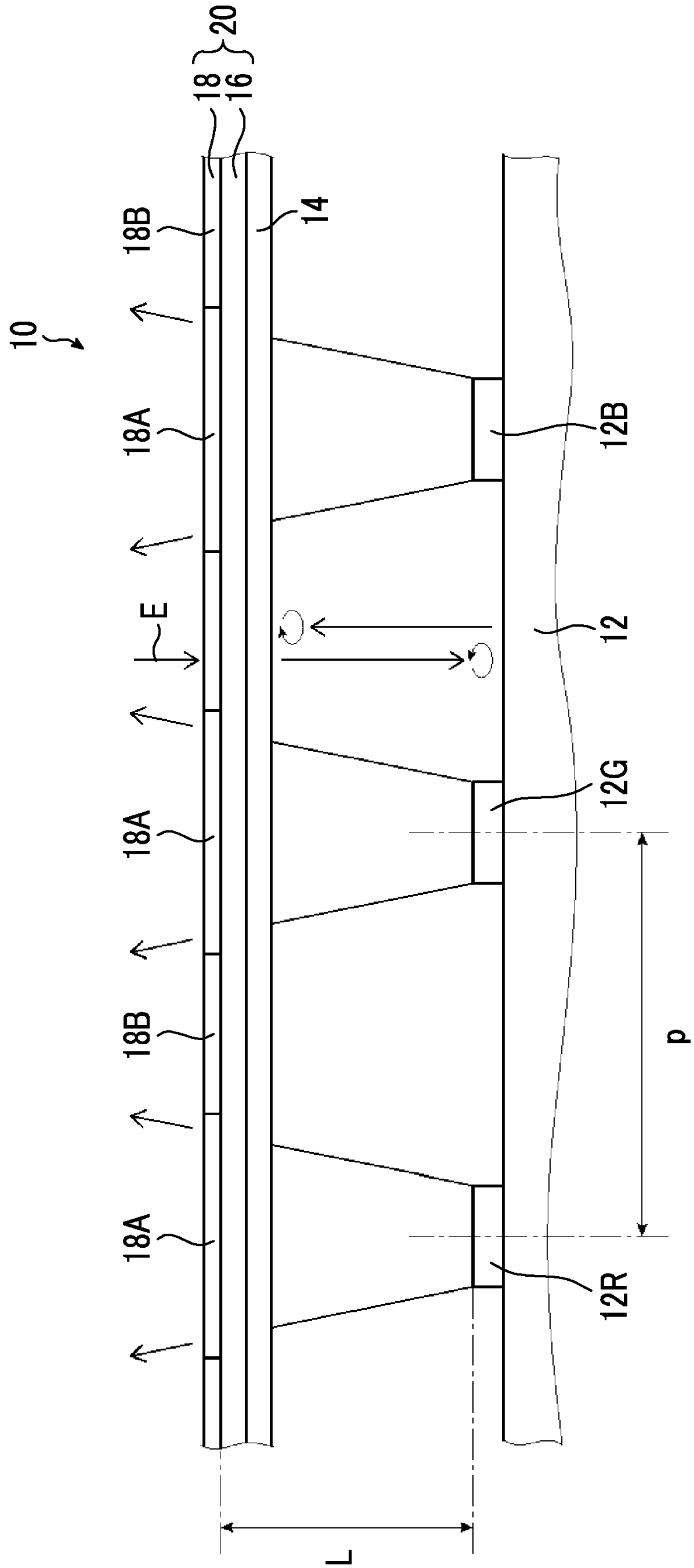
FIG. 1 is a conceptual view of an example of a display device according to the present invention.

Hereinafter, an electroluminescent display device according to an embodiment of the present invention will be described in detail based on preferred embodiments shown in the accompanying drawings.

The description of the constituent elements described below may be made based on representative embodiments of the present invention, but the present invention is not limited to the following embodiments.

In the specification, the numerical range indicated by "to" means a range including the numerical values before and after "to" as a lower limit value and an upper limit value.

In addition, in the specification, the term "(meth) acrylate" means at least one of acrylate or methacrylate or both. The same applies to the term "(meth) acryloyl" and the like.

In the present invention, visible light is light of a wavelength that can be seen by human eyes among the electromagnetic waves and refers to light in a wavelength range of 380 to 780 nm. Non-visible light is light in a wavelength range less than 380 nm or a wavelength range exceeding 780 nm.

In addition, although not limited thereto, in visible light, light in a wavelength range of 420 to 490 nm is blue light, light in a wavelength range of 495 to 570 nm is green light, and light in a wavelength range of 620 to 750 nm is red light.

In the present invention, the polarization degree of each region of a polarizing plate may be obtained by obtaining the MD transmittance and the TD transmittance of the polarizing plate in a wavelength range of 380 to 780 nm, calculating the polarization degree (%) at each wavelength by Formula (1) below, and further performing luminosity correction using a 2-degree field of view (C light source) of JIS Z 8701. The polarization degree of each region of the polarizing plate is also referred to as the luminosity corrected polarization degree.

$$\text{Polarization degree}(\%)=[(MD-TD)/(MD+TD)]^{1/2}\times 100 \quad \text{Formula (1)}$$

In addition, the single transmittance of each region of the polarizing plate may be obtained by obtaining the MD transmittance and the TD transmittance of the polarizing plate in a wavelength range of 380 to 780 nm, calculating the single transmittance at each wavelength by Formula (2) below, and further, performing luminosity correction using a 2-degree field of view (C light source) of JIS Z 8701. The single transmittance of each region of the polarizing plate is also referred to as a luminosity corrected single transmittance.

$$\text{Single transmittance}(\%)=(MD+TD)/2 \quad \text{Formula (2)}$$

The "MD transmittance" is the transmittance obtained in a case where the direction of incident polarized light on a polarizing plate sample and the transmission axis of the polarizing plate sample are made to be parallel to each other, and is expressed as "MD" in Formulae (1) and (2). In addition, the "TD transmittance" is the transmittance obtained when the direction of incident polarized light on the polarizing plate sample and the transmission axis of the polarizing plate sample are made to be orthogonal to each other, and is expressed as "TD" in Formulae (1) and (2).

The electroluminescent (EL) display device according to the embodiment of the present invention is a self-light emitting type display device that uses an inorganic EL light emitting element, an organic EL light emitting element, and the like, and has an EL substrate having a plurality of EL light emitting elements, a λ/4 wavelength plate, and a polarizing plate in this order.

In addition, the polarizing plate has a patterned polarizing layer which has a region A having a polarization degree of less than 80% and a region B having a polarization degree of 80% or more and has a distribution of the polarization degree in the plane (in a plane direction). In addition, in the EL display device according to the embodiment of the present invention, the position of the region A of the patterned polarizing layer and the position of the EL light emitting element of the EL substrate correspond to each other.

According to such an EL display device according to the embodiment of the present invention, it is possible to achieve both external light reflection prevention and improvement in utilization efficiency of light emitted from the light emitting element in a self-light emitting type display device or the like.

FIG. 1 is a conceptual view of an example of an EL display device according to an embodiment of the present invention. In the following description, the EL display device of according to the embodiment of the present invention is also simply referred to as a display device.

A display device 10 shown in FIG. 1 is a self-light emitting type display device that uses an inorganic EL light emitting element or the like as described above, and has an EL substrate 12, a λ/4 wavelength plate 14, and a polarizing plate 20.

The polarizing plate 20 has a support 16 and a patterned polarizing layer 18. The patterned polarizing layer 18 has a region 18A having a polarization degree of less than 80% and a region 18B having a polarization degree of 80% or more. That is, in the patterned polarizing layer 18, the region 18A is a region A in the present invention and the region 18B is a region B in the present invention.

<EL Substrate>

The EL substrate 12 is a known EL substrate having an EL light emitting element that is used in an inorganic EL display device, an organic EL display device, and the like.

The display device 10 in the shown example enables full color image display, and the EL substrate 12 emits an R light emitting element 12R that emits red light, a G light emitting element 12G that emits green light, and a B light emitting element 12B that emits blue light. In the following description, in a case where there is no need to distinguish the R light emitting element 12R, the G light emitting element 12G, and the B light emitting element 12B, the R light emitting element 12R, the G light emitting element 12G, and the B light emitting element 12B are collectively referred to as a "light emitting element".

Similar to a known EL substrate, on the EL substrate 12, a large number of such R light emitting elements 12R, G light emitting elements 12G, and B light emitting elements 12B are arranged two-dimensionally.

In the present invention, as the EL substrate 12, various known EL substrates used for a self-light emitting type display device using an inorganic EL light emitting element, an organic EL light emitting element, or the like can be used.

Figure 2:
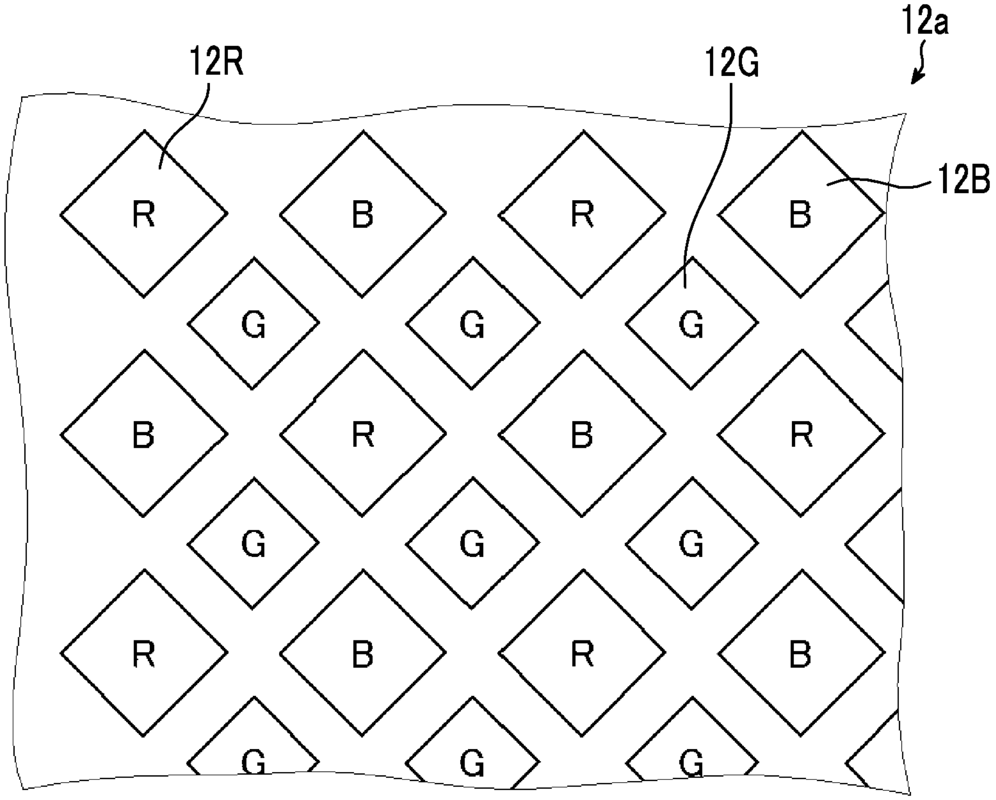
FIG. 2 is a view conceptually showing an example of an EL substrate used in the display device according to the present invention.

Accordingly, in the EL substrate 12, the R light emitting element 12R, the G light emitting element 12G, and the B light emitting element 12B using organic EL (organic light emitting diode (OLED)) may be arranged as in an EL substrate 12*a* conceptually shown in FIG. 2.

Figure 3:
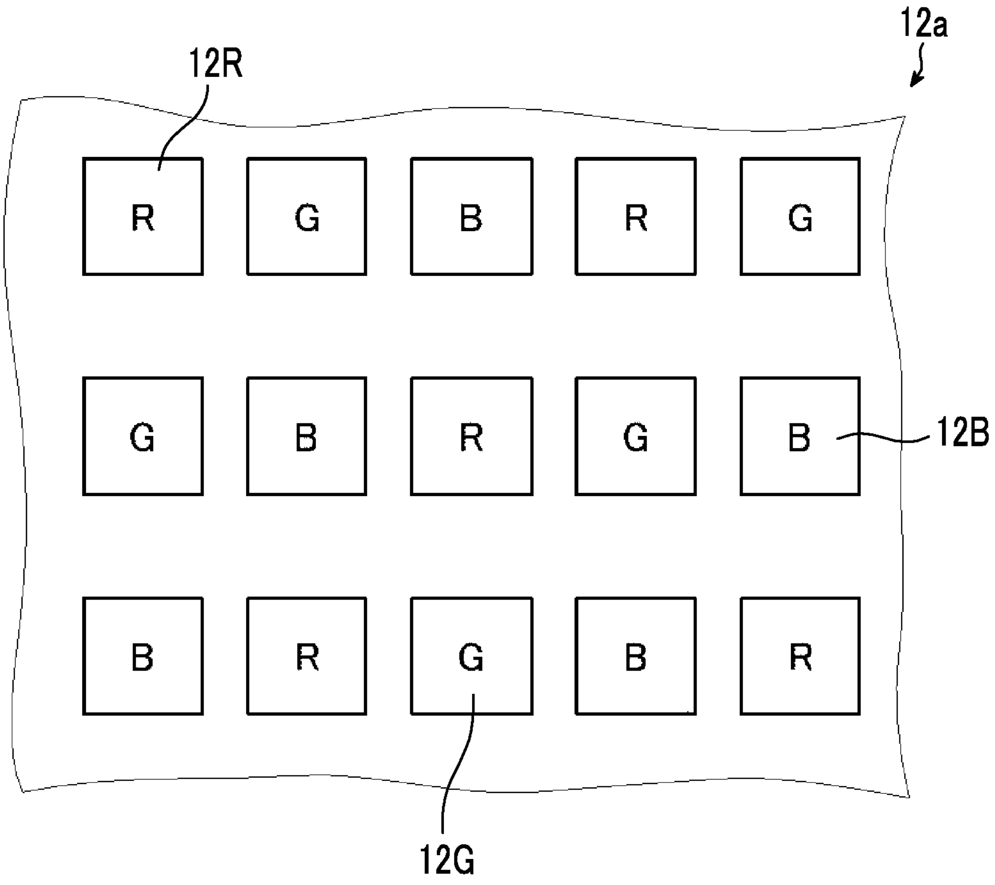
FIG. 3 is a view conceptually showing another example of the EL substrate used in the display device according to the present invention.

In the EL substrate 12, the R light emitting element 12R, the G light emitting element 12G, and the B light emitting element 12B using inorganic EL may be arranged as in an EL substrate 12*b* conceptually shown in FIG. 3. The inorganic EL is a so-called light emitting diode (LED).

Figure 4:
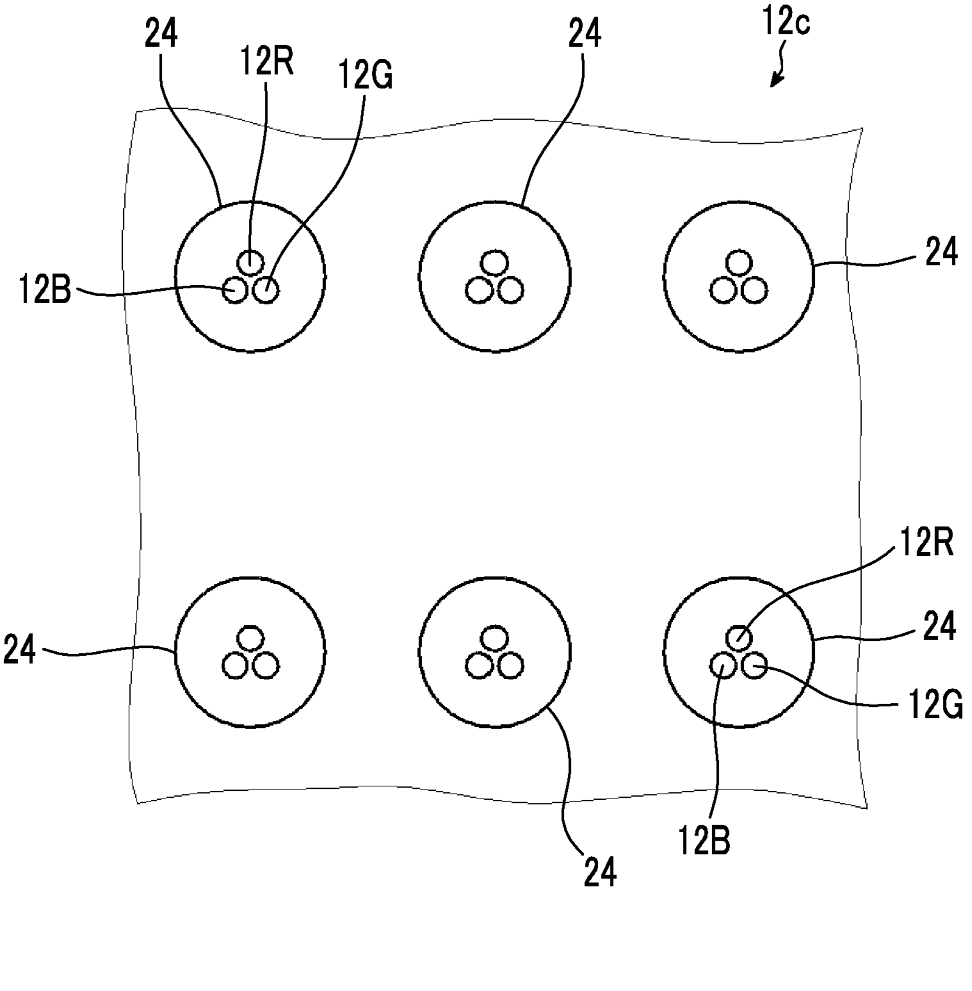
FIG. 4 is a view conceptually showing still another example of the EL substrate used in the display device according to the present invention.

Further, the EL substrate 12 may be an EL substrate in which light emitting units 24 having an R light emitting element 12R, a G light emitting element 12G, and a B light emitting element 12B, which are fine inorganic EL light emitting elements, are two-dimensionally arranged as in an EL substrate 12*c* conceptually shown in FIG. 4.

In the display device 10 according to the embodiment of the present invention, the area ratio of the light emitting elements on the EL substrate 12 is not limited. The area ratio of the light emitting elements on the EL substrate 12 is preferably 30% or less, more preferably 10% or less, even more preferably 3% or less, and still even more preferably 1% or less.

As will be described later, in the display device 10 according to the embodiment of the present invention, the patterned polarizing layer 18 has the region 18A having a polarization degree of less than 80% and the region 18B having a polarization degree of 80% or more, and the position of the region 18A having a polarization degree of less than 80% in the patterned polarizing layer 18 corresponds to the position of the light emitting element of the EL substrate 12. Therefore, by setting the area ratio of the light emitting elements on the EL substrate 12 to 30% or less, the area of the region B that contributes to external light reflection prevention is increased, and more suitably, the utilization efficiency of light emitted from the light emitting element is sufficiently secured, so that an effect of preventing reflection of external light can be improved.

The external light reflection in the display device 10 according to the embodiment of the present invention is determined by the external light reflectivity at each position in the plane and the area ratio thereof in a case of being viewed from a general viewing distance according to the display device. That is, the screen resolution of the display device 10 does not contribute to the restraint of external light reflection. On the other hand, it is preferable that the screen resolution of the display device 10 is high from the viewpoint of providing a display device having excellent display quality.

In order to reduce the area ratio of the light emitting elements in the display device 10, it is required to increase the output of the light emitting element to obtain sufficient brightness. In this respect, the light emitting element on the EL substrate 12 is preferably an inorganic EL light emitting element (so-called LED). By using the inorganic EL light emitting element, sufficient brightness can be obtained even in a case where the area ratio of the light emitting element is set to be in a range of preferably 30% or less, more preferably 10% or less, even more preferably 3% or less, and still even more preferably 1% or less.

It is preferable to use a fine inorganic EL light emitting element in order to obtain the display device 10 in which high resolution and sufficient brightness are realized while the area ratio of the light emitting elements is reduced. As the fine inorganic EL light emitting element, an inorganic EL light emitting element in which the diameter of a circle inscribed in the inorganic EL light emitting element is 360 μm or less is preferable, an inorganic EL light emitting element in which the diameter of the inscribed circle is 200 μm or less is more preferable, an inorganic EL light emitting element in which the diameter of the inscribed circle is 100 μm or less is even more preferable, and an inorganic EL light emitting element in which the diameter of the inscribed circle is 50 μm or less is still even more preferable.

In one aspect, the EL substrate 12 may be a transparent substrate. In addition, it is preferable that the inorganic EL light emitting element may be arranged on a transparent substrate. By using the transparent substrate, it is possible to realize a display device having high designability in which the background of the display device can be seen through and the reflection of external light on the surface of the substrate is suppressed.

In the display device 10 in the shown example, the EL substrate 12 has the R light emitting element 12R, the G light emitting element 12G, and the B light emitting element 12B and enables full color image display or the like, but the present invention is not limited thereto.

For example, the organic EL substrate may have only the R light emitting element 12R, the G light emitting element 12G, or the B light emitting element 12B, and may enable a monochrome image (monochromic image) display. Alternatively, the organic EL substrate may have the R light emitting element 12R and the G light emitting element 12G, the R light emitting element 12R and the B light emitting element 12B, or the G light emitting element 12G and the B light emitting element 12B, and may enable two-color image display or the like.

In addition, in the display device according to the embodiment of the present invention, a commercially available self-light emitting type display device (display) using an inorganic EL light emitting element, an organic EL light emitting element, or the like may be used as the EL substrate 12 as long as the circularly polarizing plate having a polarizing plate (polarizer) and a λ/4 wavelength plate is not provided as an antireflection layer. Further, the commercially available display device may have a touch panel or the like.

<λ/4 Wavelength Plate>

The "λ/4 wavelength plate" is a plate having a λ/4 function and is specifically a plate having a function of converting linearly polarized light with a specific wavelength into circularly polarized light or converting circularly polarized light into linearly polarized light.

The λ/4 wavelength plate 14 is not limited, and various known plates having a λ/4 function can be used. Specific examples of the λ/4 wavelength plate 14 include those described in US2015/0277006A.

For example, as an aspect in which the λ/4 wavelength plate 14 has a single layer structure, specifically, a phase difference film in which an optically anisotropic layer having a λ/4 function is provided on a stretched polymer film or a support may be used. In addition, as an aspect in which the λ/4 wavelength plate has a multilayered structure, a broadband λ/4 plate having a laminate of a λ/4 wavelength plate and a λ/2 wavelength plate may be used.

The thickness of the λ/4 wavelength plate 14 is not particularly limited, but it is preferable that the thickness is thin.

By making the λ/4 wavelength plate 14 thin, the EL substrate 12 and the polarizing plate 20 (the patterned polarizing layer 18) can be brought close to each other, and the angle of view from the light emitting element to the region 18A of the patterned polarizing layer 18 is increased. As a result, the utilization efficiency of light emitted from the light emitting element can be improved.

The thickness of the λ/4 wavelength plate 14 is preferably 1 to 5 μm, more preferably 1 to 4 μm, and even more preferably 1 to 3 μm.

<Polarizing Plate>

In the display device 10 in the shown example, the polarizing plate 20 has the support 16 and the patterned polarizing layer 18.

As described above, the patterned polarizing layer 18 has the region 18A having a polarization degree of less than 80% and the region 18B having a polarization degree of 80% or more. The region 18A is the region A in the present invention, and the region 18B is the region B in the present invention.

Figure 5:
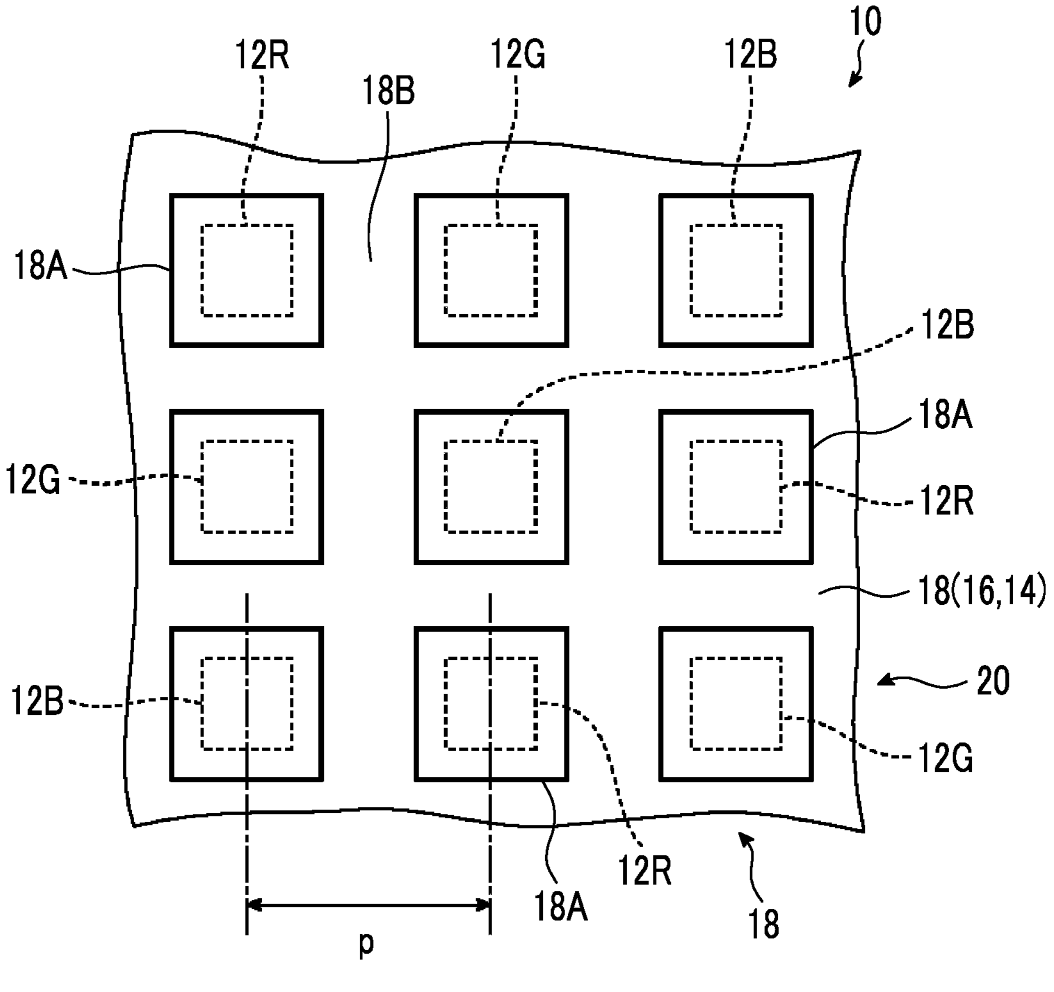
FIG. 5 is a conceptual view for illustrating a configuration of the display device shown in FIG. 1.

FIG. 5 conceptually shows a display surface side (observation surface side) of the display device 10, that is, a view (plan view) viewed from above in the drawing of FIG. 1. That is, FIG. 5 is a view of the display device 10 viewed from the front of the display surface, in other words, a view of the display device 10 viewed from the normal direction of the display surface. The normal direction of the display surface is a direction orthogonal to the display surface.

As shown in FIG. 5, in the display device 10, the position of the region 18A of the patterned polarizing layer 18 and the position of the light emitting element of the EL substrate 12 correspond to each other.

The present invention realizes a display device capable of achieving both an effect of preventing reflection of external light and improvement in utilization efficiency of light emitted from the light emitting element by adopting such a configuration.

As described above, in the self-light emitting type display device using an inorganic EL light emitting element, an organic EL light emitting element, and the like, a circularly polarizing plate in which a polarizing plate and a λ/4 wavelength plate are laminated is used as an antireflection film to prevent a decrease in contrast in a bright room environment due to reflection of external light.

That is, as shown in FIG. 1, in a case where external light E is made incident on the polarizing plate, a linearly polarized light component in the same direction as the transmission axis is transmitted according to the direction of the transmission axis of the polarizing plate, but a linearly polarized light component orthogonal to the transmission axis is absorbed by the polarizer. The linearly polarized light transmitted through the polarizer is converted into circularly polarized light by the λ/4 wavelength plate and then is reflected by the EL substrate, and the revolution direction of the circularly polarized light is reversed. The circularly polarized light reflected by the EL substrate is made incident on the λ/4 wavelength plate again and is converted into linearly polarized light. Here, the rotation direction of the circularly polarized light that is made re-incident on the λ/4 wavelength plate is opposite to the revolution direction of the previously converted circularly polarized light. Therefore, the linearly polarized light that is made re-incident on the λ/4 wavelength plate and converted is linearly polarized light in a direction orthogonal to the transmission axis of the polarizing plate.

However, since the light emitted from a light emitting element such as an inorganic EL light emitting element is generally unpolarized light, the circularly polarizing plate in which a polarizing plate and a λ/4 wavelength plate are laminated absorbs almost half of the energy. Therefore, the conventional self-light emitting type display device has a problem that the utilization efficiency of light from the light emitting element is low.

In contrast, the display device 10 according to the embodiment of the present invention has a circularly polarizing plate consisting of the polarizing plate 20 and the λ/4 wavelength plate 14. As described above, the polarizing plate 20 has the patterned polarizing layer 18 having regions having different polarization degrees, and the patterned polarizing layer 18 has the region A having a polarization degree of less than 80% and the region B having a polarization degree of 80% or more.

Further, in the display device 10 according to the embodiment of the present invention, the position of the region A corresponds to the position of the light emitting element of the EL substrate 12 on the display device 10.

Therefore, according to the display device 10 according to the embodiment of the present invention, the external light E incident on the region B is prevented from being reflected by the circularly polarizing plate as described above, and thus a reduction in the contrast caused by the reflection of the external light can be suppressed. On the other hand, since the light emitted from the light emitting element is made incident on the region A where the polarization degree, that is, the absorbance of linearly polarized light is low, a large number of light components can be transmitted.

Therefore, according to the display device 10 of the present invention, it is possible to achieve both an effect of preventing reflection of external light and improvement in utilization efficiency of light emitted from the light emitting element of the EL substrate 12.

In the present invention, the fact that the position of the region 18A of the patterned polarizing layer 18 and the position of the light emitting element of the EL substrate 12 correspond to each other indicates that in a case where the display device 10 is viewed from the normal direction of the display surface, the region 18A of the patterned polarizing layer 18 and at least a part of the light emitting element of the EL substrate 12 overlap with each other, and preferably, the region 18A of the patterned polarizing layer 18 includes the light emitting element of the EL substrate 12.

In addition, it is preferable that the centers (the optical axis in the light emitting element) of the region 18A of the patterned polarizing layer 18 and the light emitting element of the EL substrate 12 coincide with each other in a case where the display device 10 is viewed from the normal direction of the display surface. Further, it is particularly preferable that the center of the region 18A of the patterned polarizing layer 18 and the center of the light emitting element of the EL substrate 12 coincide with each other, and the region 18A of the patterned polarizing layer 18 includes the light emitting element of the EL substrate 12.

In a case of an EL substrate formed by arranging the light emitting units 24 having the R light emitting element 12R, the G light emitting element 12G, and the B light emitting element 12B as in the EL substrate 12*c* shown in FIG. 4, the center of the light emitting element refers to the center of a circle inscribed to the three light emitting elements (a plurality of light emitting elements) constituting the light emitting unit 24. In this regard, for example, the same applies to the following description for the pitch of the light emitting elements and the like.

In the polarizing plate 20, the polarization degree of the region 18A (region A) of the patterned polarizing layer 18 is less than 80%.

In a case where the polarization degree of the region 18A exceeds 80%, the light emitted from the light emitting element cannot be fully utilized.

The polarization degree of at least a part or entirety of the region 18A is more preferably 30% or less, more preferably 10% or less, and even more preferably 3% or less.

In the display device 10 according to the embodiment of the present invention, the polarization degree of the region 18B (region B) of the patterned polarizing layer 18 is 80% or more.

In a case where the polarization degree of the region 18B is less than 80%, a sufficient effect of preventing reflection of external light cannot be obtained.

The polarization degree of the region 18B is preferably 90% or more, and more preferably 95% or more.

In the polarizing plate 20, the single transmittance of the region 18A having a low polarization degree is preferably 50% or more. In the present invention, the single transmittance is the transmittance of only the region 18A in the patterned polarizing layer 18, and the measuring method is as described above.

By setting the single transmittance of the region 18A in the patterned polarizing layer 18 to 50% or more, the utilization efficiency of light emitted from the light emitting element can be improved.

The single transmittance of the region 18A is more preferably 80% or more and even more preferably 90% or more.

In the display device 10 according to the embodiment of the present invention, the region 18A and/or the region 18B of the patterned polarizing layer 18 may have regions having different polarization degrees in the plane. In other words, in the region 18A and/or the region 18B of the patterned polarizing layer 18, the polarization degree may be changed in the plane.

Specifically, in the region 18A, a region close to the region 18B may have a region having a high polarization degree in comparison with a region spaced from the region 18B. In addition, in the region 18B, a region close to the region 18A may have a region having a low polarization degree in comparison with a region spaced from the region 18A.

In other words, the region 18A has a configuration having a region in which a low polarization degree is uniform in the plane and a region in which the polarization degree is high in the vicinity of the end portion, and/or the region 18B has a configuration having a region in which the polarization degree is high and uniform in the plane and a region in which the polarization degree is low in the vicinity of the end portion. Then, the patterned polarizing layer 18 may be formed so that a region of the region 18A having a high polarization degree and the region 18B are continuous in the plane, and/or a region degree of the region 18B having a low polarization and the region 18A are continuous in the plane.

With such a configuration, the EL substrate 12 and the polarizing plate 20 can be easily aligned. That is, the robustness of the alignment between the EL substrate 12 and the polarizing plate 20 can be enhanced.

Here, the change in the polarization degree (the distribution of the polarization degree) in the region 18A and/or the region 18B may be stepwise or continuous, but is preferably continuous.

That is, it is preferable that the region 18A has a region in which the polarization degree gradually increases in the vicinity of the end portion toward the region 18B, and/or the region 18B has a region in which the polarization degree gradually decreases toward the region 18A in the vicinity of the end portion.

Thus, the EL substrate 12 and the polarizing plate 20 can be more easily aligned with each other. Further, it is possible to reduce a change in brightness in a case where the display device is obliquely observed as compared to a case where the display device is observed from the front. That is, the viewing angle properties can be improved.

In a case where a change in the polarization degree in the region 18A and/or the region 18B is stepwise, the change in the polarization degree may be one-step change or multi-step change.

In the polarizing plate 20 shown in FIG. 5, the region 18A of the patterned polarizing layer 18 is a square, but the present invention is not limited thereto. That is, as the shape of the region 18A in the plan view of the display device 10, various shapes can be used according to the light emission properties of the light emitting elements, the arrangement of the light emitting elements, and the like. The light emission properties of the light emitting element are, for example, the spread angle of emitted light.

Figure 6:
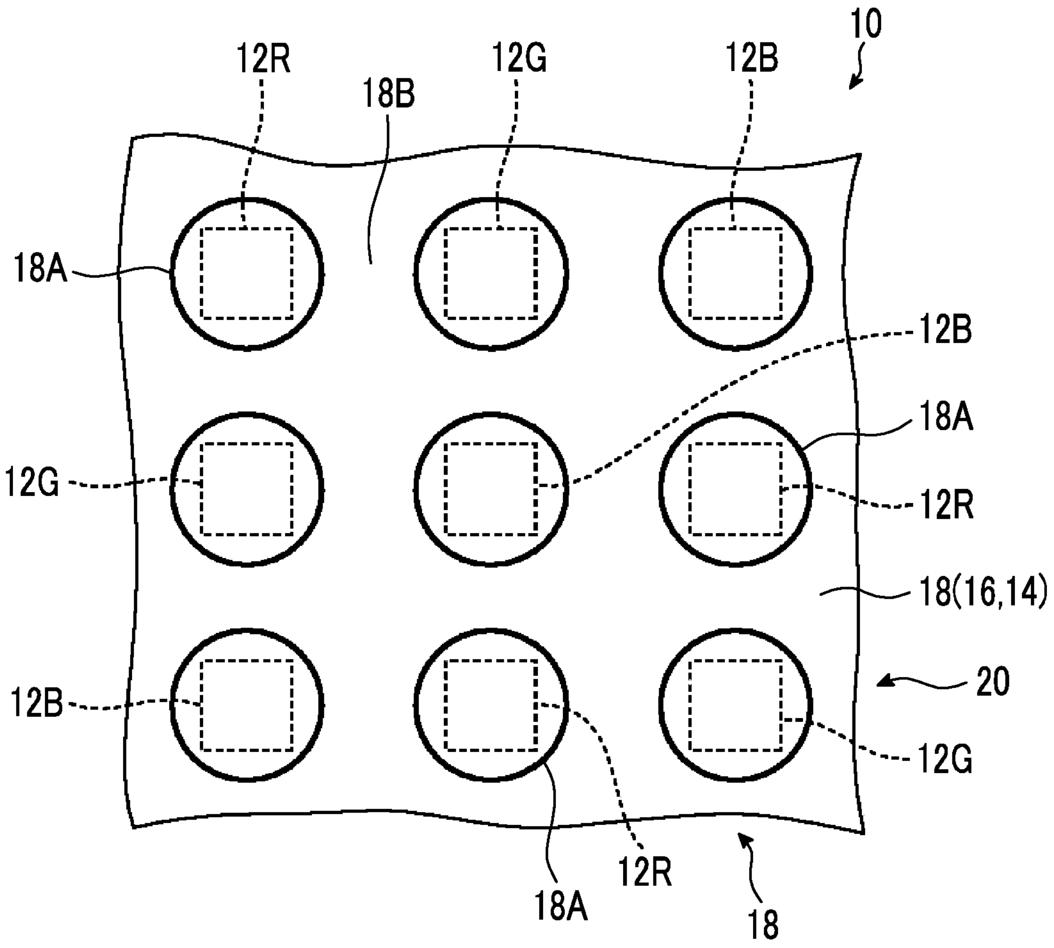
FIG. 6 is a conceptual view for illustrating a configuration of another example of the display device according to the present invention.

For example, as conceptually shown in a plan view in FIG. 6, the region 18A of the patterned polarizing layer 18 may have a circular shape. Alternatively, the region 18A may have an elliptical shape, or a triangle shape or a pentagon or more polygonal shape.

In any shape, the center of the region A may be set to the center of the circle inscribed in the region A.

As described above, in the display device 10 according to the embodiment of the shown example, the polarizing plate 20 has the support 16 and the patterned polarizing layer 18.

As the support 16 of the polarizing plate 20, various transparent sheet-like materials (films and plate-like materials) having sufficient light transmittance can be used.

Examples of the materials forming the support 16 include polycarbonate-based polymers; polyester-based polymers such as polyethylene terephthalate (PET) and polyethylene naphthalate; acrylic polymers such as polymethyl methacrylate; styrene-based polymers such as polystyrene, and acrylonitrile-styrene copolymers (AS resins); polyolefin-based polymers such as polyethylene, polypropylene, and ethylene-propylene copolymers; vinyl chloride-based polymers; amide-based polymers such as nylon, and aromatic polyamide; imide-based polymers; sulfone-based polymers; polyethersulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; and epoxy-based polymers.

As the material forming the support 16, a thermoplastic norbornene-based resin can be preferably used. Examples of such a thermoplastic norbornene-based resin include ZEONEX and ZEONOR manufactured by Nippon Zeon Co., Ltd., and ARTON manufactured by JSR Corporation.

In addition, as the material forming the support 16, a cellulose-based polymer typified by triacetyl cellulose (TAC) can also be preferably used.

In the display device according to the embodiment of the present invention, the thickness of the support 16 of the polarizing plate 20 is not limited, and may be appropriately set according to the material for forming the support 16 and the like.

The thickness of the support 16 is preferably 100 μm or less, more preferably 80 μm or less, and even more preferably 10 to 80 μm.

The patterned polarizing layer 18 can be formed of various known materials used for a polarizer.

Here, in the display device 10 according to the embodiment of the present invention, it is preferable that the patterned polarizing layer 18 is a material that exhibits polarization performance by coating without a stretching treatment from the viewpoint of pattern formation described later. More specifically, the patterned polarizing layer 18 preferably includes a liquid crystal compound and a coloring agent. In addition, as the coloring agent, a dichroic dye compound is preferably exemplified.

<Dichroic Dye Compound>

In the display device 10 according to the embodiment of the present invention, various known compounds can be used as the dichroic dye compound used in the patterned polarizing layer 18, but a dichroic dye compound represented by Formula (1) below (hereinafter, also referred to as "specific dichroic dye compound") is suitably exemplified.

$$L^1\text{-}A^1\text{-}N{=}N\text{-}(A^2\text{-}N{=}N)_m\text{-}A^3\text{-}L^2 \quad (1)$$

Here, in Formula (1), $A^1$, $A^2$ and $A^3$ each independently represent a divalent aromatic group which may have a substituent.

In addition, in Formula (1), $L^1$ and $L^2$ each independently represent a substituent.

In Formula (1), m represents an integer of 1 to 4, and in a case where m is an integer of 2 to 4, a plurality of $A^2$'s may be the same as or different from each other. Note that m is preferably 1 or 2.

The "divalent aromatic group which may have a substituent" represented by $A^1$, $A^2$ and $A^3$ in Formula (1) will be described.

Examples of the substituent include the substituent group G described in paragraphs to [0240] of JP2011-237513A, and among these, a halogen atom, an alkyl group, an alkoxy group, an alkoxycarbonyl group, an aryloxycarbonyl group, and the like are preferable. Examples of the alkoxycarbonyl group include methoxycarbonyl and ethoxycarbonyl. Examples of the aryloxycarbonyl group include phenoxycarbonyl, 4-methylphenoxycarbonyl, and 4-methoxyphenylcarbonyl. Among these, an alkyl group is more suitable, and an alkyl group having 1 to 5 carbon atoms is even more suitable.

On the other hand, examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among these, a phenylene group is preferable.

Further, the divalent aromatic heterocyclic group described above is preferably a group derived from a monocyclic or bicyclic heterocyclic ring. Examples of the atoms constituting the aromatic heterocyclic group other than carbon include a nitrogen atom, a sulfur atom, and an oxygen atom. In a case where the aromatic heterocyclic group has a plurality of atoms constituting a ring other than carbon, these atoms may be the same as or different from each other. Specific examples of the aromatic heterocyclic group include a pyridylene group (pyridine-diyl group), a quinolylene group (quinolin-diyl group), an isoquinolylene group (isoquinolin-diyl group), a benzothiadiazole-diyl group, a phthalimido-diyl group, and a thienothiazole-diyl group (hereinafter, abbreviated as "thienothiazole group").

Among these divalent aromatic groups, a divalent aromatic hydrocarbon group is preferable.

Here, it is preferable that any one of A', $A^2$ and $A^3$ is a divalent thienothiazole group which may have a substituent. Specific examples of the substituent of the divalent thienothiazole group are the same as those of the above-mentioned "divalent aromatic group which may have a substituent", and the preferable embodiment is also the same.

Further, among $A^1$, $A^2$ and $A^3$, it is more preferable that $A^2$ is a divalent thienothiazole group. In this case, $A^1$ and $A^2$ represent a divalent aromatic group which may have a substituent.

In a case where $A^2$ is a divalent thienothiazole group, it is preferable that at least one of $A^1$ or $A^2$ represents a divalent aromatic hydrocarbon group which may have a substituent, and it is more preferable that both $A^1$ and $A^2$ represent a divalent aromatic hydrocarbon group which may have a substituent.

The "substituent" represented by $L^1$ and $L^2$ in Formula (1) will be described.

As the above-mentioned substituent, a group introduced to enhance solubility or nematic liquid crystallinity, a group having electron donating properties or electron withdrawing properties introduced to adjust color tone as a coloring agent, or a group having a crosslinkable group (polymerizable group) introduced to fix the alignment is preferable.

Examples of the substituent include an alkyl group, an alkenyl group, an alkynyl group, an aryl group, a substituted or unsubstituted amino group, an alkoxy group, an oxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a sulfonyl group, an ureido group, a phosphoric acid amide group, a hydroxy group, a mercapto group, a halogen atom, a cyano group, a nitro group, a hydroxamic acid group, a sulfino group, a hydrazino group, an imino group, an azo group, a heterocyclic group, and a silyl group.

The alkyl group is an alkyl group having preferably 1 to 20 carbon atoms, more preferably 1 to 12 carbon atoms, and particularly preferably 1 to 8 carbon atoms, and examples thereof include a methyl group, an ethyl group, an isopropyl group, a tert-butyl group, an n-octyl group, an n-decyl group, an n-hexadecyl group, a cyclopropyl group, a cyclopentyl group, and a cyclohexyl group.

The alkenyl group is an alkenyl group having preferably 2 to 20 carbon atoms, more preferably 2 to 12 carbon atoms, and particularly preferably 2 to 8 carbon atoms, and examples thereof include a vinyl group, an allyl group, a 2-butenyl group, and a 3-pentenyl group.

The alkynyl group is an alkynyl group having preferably 2 to 20 carbon atoms, more preferably 2 to 12 carbon atoms, and particularly preferably 2 to 8 carbon atoms, and examples thereof include a propargyl group and a 3-pentynyl group.

The aryl group is an aryl group having preferably 6 to 30 carbon atoms, more preferably 6 to 20 carbon atoms, and particularly preferably 6 to 12 carbon atoms, and examples thereof include a phenyl group, a 2,6-diethylphenyl group, a 3,5-ditrifluoromethylphenyl group, a styryl group, a naphthyl group, and a biphenyl group.

The substituted or unsubstituted amino group is preferably an amino group having 0 to 20 carbon atoms, more preferably 0 to 10 carbon atoms, and particularly preferably 0 to 6 carbon atoms, and examples thereof include an unsubstituted amino group, a methylamino group, a dimethylamino group, a diethylamino group, and an anilino group.

The alkoxy group is an alkoxy group having preferably 1 to 20 carbon atoms, and more preferably 1 to 15 carbon atoms, and examples thereof include a methoxy group, an ethoxy group, and a butoxy group.

The oxycarbonyl group is an oxycarbonyl group having preferably 2 to 20 carbon atoms, more preferably 2 to 15 carbon atoms, and particularly preferably 2 to 10 carbon atoms, and examples thereof include a methoxycarbonyl group, an ethoxycarbonyl group, and a phenoxycarbonyl group.

The acyloxy group is an acyloxy group having preferably 2 to 20 carbon atoms, more preferably 2 to 10 carbon atoms, and particularly preferably 2 to 6 carbon atoms, and examples thereof include an acetoxy group, a benzoyloxy group, an acryloyl group, and a methacryloyl group.

The acylamino group is an acylamino group having preferably 2 to 20 carbon atoms, more preferably 2 to 10 carbon atoms, and particularly preferably 2 to 6 carbon atoms, and examples thereof include an acetylamino group and a benzoylamino group.

The alkoxycarbonylamino group is an alkoxycarbonylamino group having preferably 2 to 20 carbon atoms, more preferably 2 to 10 carbon atoms, and particularly preferably 2 to 6 carbon atoms, and examples thereof include a methoxycarbonylamino group.

The aryloxycarbonylamino group is an aryloxycarbonylamino group having preferably 7 to 20 carbon atoms, more preferably 7 to 16 carbon atoms, and particularly preferably 7 to 12 carbon atoms, and examples thereof include a phenyloxycarbonylamino group.

The sulfonylamino group is a sulfonylamino group having preferably 1 to 20 carbon atoms, more preferably 1 to 10 carbon atoms, and particularly preferably 1 to 6 carbon atoms, and examples thereof include a methanesulfonylamino group and a benzenesulfonylamino group.

The sulfamoyl group is a sulfamoyl group having preferably 0 to 20 carbon atoms, more preferably 0 to 10 carbon atoms, and particularly preferably 0 to 6 carbon atoms, and examples thereof include a sulfamoyl group, a methylsulfamoyl group, a dimethylsulfamoyl group, and a phenylsulfamoyl group.

The carbamoyl group is a carbamoyl group having preferably 1 to 20 carbon atoms, more preferably 1 to 10 carbon atoms, and particularly preferably 1 to 6 carbon atoms, and examples thereof include an unsubstituted carbamoyl group, a methylcarbamoyl group, a diethylcarbamoyl group, and a phenylcarbamoyl group.

The alkylthio group is an alkylthio group having preferably 1 to 20 carbon atoms, more preferably 1 to 10 carbon atoms, and particularly preferably 1 to 6 carbon atoms, and examples thereof include a methylthio group, and an ethylthio group.

The arylthio group is an arylthio group having preferably 6 to 20 carbon atoms, more preferably 6 to 16 carbon atoms, and particularly preferably 6 to 12 carbon atoms, and examples thereof include a phenylthio group.

The sulfonyl group is a sulfonyl group having preferably 1 to 20 carbon atoms, more preferably 1 to 10 carbon atoms, and particularly preferably 1 to 6 carbon atoms, and examples thereof include a mesyl group and a tosyl group.

The sulfinyl group is a sulfinyl group having preferably 1 to 20 carbon atoms, more preferably 1 to 10 carbon atoms, and particularly preferably 1 to 6 carbon atoms, and examples thereof include a methanesulfinyl group and a benzenesulfinyl group.

The ureido group is a ureido group having preferably 1 to 20 carbon atoms, more preferably 1 to 10 carbon atoms, and particularly preferably 1 to 6 carbon atoms, and examples thereof include an unsubstituted ureido group, a methylureido group, and a phenyl ureido group.

The phosphoric acid amide group is a phosphoric acid amide group having preferably 1 to 20 carbon atoms, more preferably 1 to 10 carbon atoms, and particularly preferably 1 to 6 carbon atoms, and examples thereof include a diethylphosphoric acid amide group and a phenylphosphoric acid amide group.

Examples of the halogen atom include a fluorine atom, a chlorine atom, a bromine atom, and an iodine atom.

The heterocyclic group is a heterocyclic group having preferably 1 to 30 carbon atoms, and more preferably 1 to 12 carbon atoms, and is, for example, a heterocyclic group having a hetero atom such as nitrogen atom, an oxygen atom, a sulfur atom, and the like. Examples thereof include an epoxy group, an oxetanyl group, an imidazolyl group, a pyridyl group, a quinolyl group, a furyl group, a piperidyl group, a morpholino group, a benzoxazolyl group, a benzimidazolyl group, and a benzthiazolyl group.

Further, the silyl group is a silyl group having preferably 3 to 40 carbon atoms, more preferably 3 to 30 carbon atoms, and particularly preferably 3 to 24 carbon atoms, and examples thereof include a trimethylsilyl group and a triphenylsilyl group.

These substituents may be further substituted with these substituents. In a case where two or more substituents are present, the substituents may be the same as or different from each other. In addition, if possible, the substituents may be bonded to each other to form a ring.

The substituent represented by $L^1$ and $L^2$ is preferably an alkyl group which may have a substituent, an alkenyl group which may have a substituent, an alkynyl group which may have a substituent, an aryl group which may have a substituent, an alkoxy group which may have a substituent, an oxycarbonyl group which may have a substituent, an acyloxy group which may have a substituent, an acylamino group which may have a substituent, an amino group which may have a substituent, an alkoxycarbonylamino group which may have a substituent, a sulfonylamino group which may have a substituent, a sulfamoyl group which may have a substituent, a carbamoyl group which may have a substituent, an alkylthio group which may have a substituent, a sulfonyl group which may have a substituent, an ureido group which may have a substituent, a nitro group, a hydroxy group, a cyano group, an imino group, an azo group, a halogen atom, or a heterocyclic group. More preferably, the substituent is an alkyl group which may have a substituent, an alkenyl group which may have a substituent, an aryl group which may have a substituent, an alkoxy group which may have a substituent, an oxycarbonyl group which may have a substituent, an acyloxy group which may have a substituent, an amino group which may have a substituent, a nitro group, an imino group, or an azo group.

It is preferable that at least one of $L^1$ or $L^2$ preferably includes a crosslinkable group (polymerizable group), and it is more preferable that both $L^1$ and $L^2$ include a crosslinkable group.

Specific examples of the crosslinkable group include polymerizable groups described in paragraphs [0040] to [0050] of JP2010-244038A, and from the viewpoint of reactivity and synthesis suitability, an acryloyl group, a methacryloyl group, an epoxy group, an oxetanyl group, and a styryl group are preferable, and an acryloyl group and a methacryloyl group are more preferable.

Examples of preferable aspects of $L^1$ and $L^2$ include an alkyl group substituted by the crosslinkable group described above, a dialkylamino group substituted by the crosslinkable group described above, and an alkoxy group substituted by the crosslinkable group described above.

In the present invention, since the alignment degree of the specific dichroic dye compound included in the patterned polarizing layer 18 is further improved, the specific dichroic dye compound preferably has a structure represented by Formula (2) below.

(2)

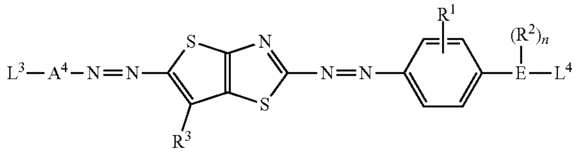

Here, in Formula (2), $A^4$ represents a divalent aromatic group which may have a substituent.

In Formula (2), $L^3$ and $L^4$ each independently represent a substituent.

In Formula (2), E represents any one of a nitrogen atom, an oxygen atom, or a sulfur atom.

In Formula (2), $R^1$ represents any group or atom of a hydrogen atom, a halogen atom, an alkyl group which may have a substituent and an alkoxy group which may have a substituent.

In Formula (2), $R^2$ represents a hydrogen atom or an alkyl group which may have a substituent.

In Formula (2), $R^3$ represents a hydrogen atom or a substituent.

In Formula (2), n represents 0 or 1. However, in a case where E is a nitrogen atom, n is 1, and in a case where E is an oxygen atom or a sulfur atom, n is 0.

Specific examples and preferable aspects of the "divalent aromatic group which may have a substituent" represented by $A^4$ in Formula (2) are the same as those of the "divalent aromatic group which may have a substituent" represented by $A^1$ to $A^3$ in Formula (1) above.

A particularly preferable aspect of $A^4$ is a phenylene group.

Specific examples and preferable aspects of the "substituent" represented by $L^3$ and $L^4$ in Formula (2) are the same as those of the "substituent" represented by $L^1$ and $L^2$ in Formula (1) above.

A more preferable aspect of $L^3$ and $L^4$ is that at least one of $L^3$ or $L^4$ includes a crosslinkable group, and an even more preferable aspect thereof is that both $L^3$ and $L^4$ include a crosslinkable group. Accordingly, the alignment degree of the specific dichroic dye compound included in the patterned polarizing layer 18 is further improved, and the high temperature durability and the moisture-heat resistance of the laminate are improved.

In addition, a more preferable aspect of the crosslinkable group of $L^3$ and $L^4$ is an acryloyl group or a methacryloyl group.

In Formula (2), E represents any one of a nitrogen atom, an oxygen atom, or a sulfur atom, and is preferably a nitrogen atom from the viewpoint of synthesis suitability.

From the viewpoint of easily allowing the specific dichroic dye compound to have absorption on the short wavelength side, E in Formula (1) above is preferably an oxygen atom. The specific dichroic dye compound having absorption on the short wavelength side is, for example, a specific dichroic dye compound having a maximum absorption wavelength at about 500 to 530 nm.

On the other hand, from the viewpoint of easily allowing the specific dichroic dye compound to have absorption on the long wavelength side, E in Formula (1) above is preferably a nitrogen atom. The specific dichroic dye compound having absorption on the long wavelength side is, for example, a specific dichroic dye compound having a maximum absorption wavelength at about 600 nm.

In Formula (2), $R^1$ represents any group or atom of a hydrogen atom, a halogen atom, an alkyl group which may have a substituent, or an alkoxy group which may have a substituent, and is preferably a hydrogen atom or an alkyl group which may have a substituent.

Next, the "alkyl group which may have a substituent" and the "alkoxy group which may have a substituent" represented by $R^1$ will be described.

Examples of the substituent include a halogen atom.

Examples of the alkyl group include linear, branched, or cyclic alkyl groups having 1 to 8 carbon atoms. Among these, a linear alkyl group having 1 to 6 carbon atoms is preferable, a linear alkyl group having 1 to 3 carbon atoms is more preferable, and a methyl group or an ethyl group is even more preferable.

Examples of the alkoxy group include an alkoxy group having 1 to 8 carbon atoms. Among these, an alkoxy group having 1 to 6 carbon atoms is preferable, an alkoxy group having 1 to 3 carbon atoms is more preferable, and a methoxy group or an ethoxy group is even more preferable.

In Formula (2), $R^2$ represents a hydrogen atom or an alkyl group which may have a substituent, and is preferably an alkyl group which may have a substituent.

Since specific examples and preferable aspects of the "alkyl group which may have a substituent" represented by $R^2$ are the same as those of the "alkyl group which may have a substituent" represented by $R^1$ of Formula (2) above, the description thereof will be omitted.

In a case where E is a nitrogen atom, $R^2$ is a group existing in Formula (2) (that is, n=1). On the other hand, in a case where E is an oxygen atom or a sulfur atom, $R^2$ is a group which does not exist in Formula (2) (that is, n=0).

In Formula (2), $R^3$ represents a hydrogen atom or a substituent.

Among these, as the specific dichroic dye compound having a structure represented by Formula (2), the compounds (D-1) to (D-53) described in paragraphs [0074] to [0081] of JP2010-152351A and the following compounds (D-54) to (D-58) may be mentioned.

(D-53)

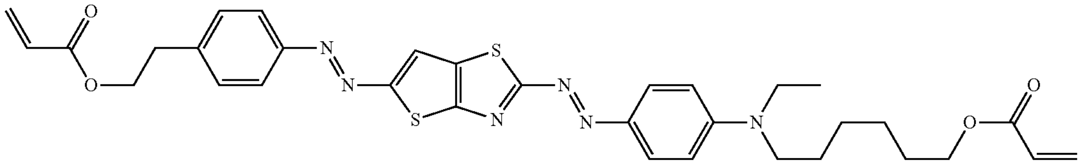

(D-54)

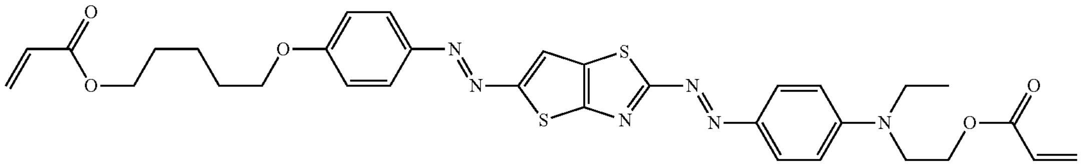

(D-55)

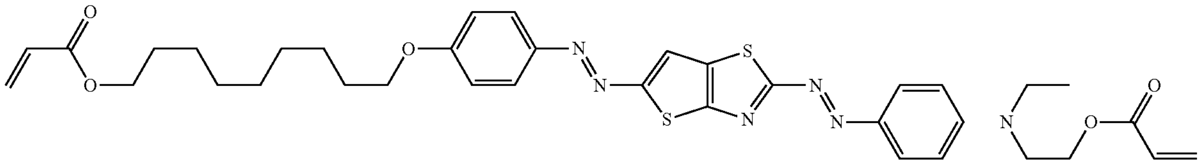

(D-56)

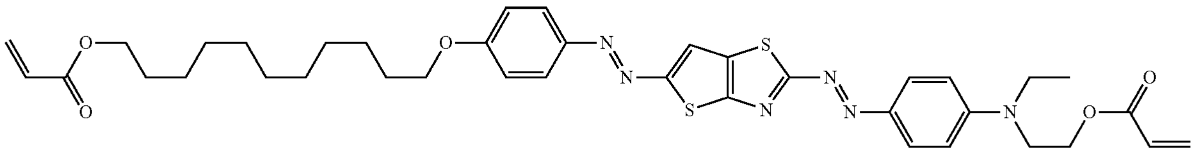

(D-57)

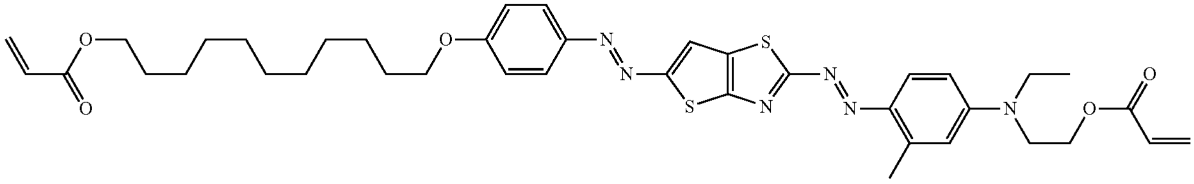

(D58)

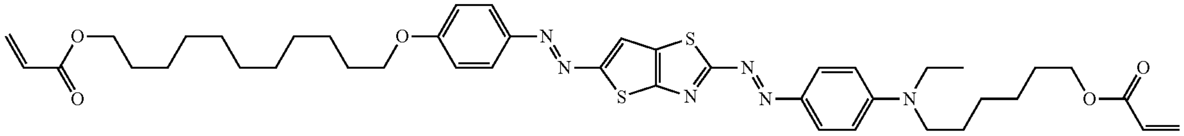

Since specific examples and preferable aspects of the "substituent" represented by $R^3$ are the same as those of the substituent in the "divalent aromatic group which may have a substituent", the description thereof will be omitted.

In Formula (2), n represents 0 or 1. However, in a case where E is a nitrogen atom, n is 1, and in a case where E is an oxygen atom or a sulfur atom, n is 0.

Specific examples of the specific dichroic dye compound represented by Formula (1) include the compounds described in paragraphs [0051] to [0081] of JP2010-152351 A, and the contents thereof are incorporated in the specification.

In the present invention, the patterned polarizing layer 18 is preferably a film formed using a coloring composition containing a liquid crystal compound together with the above-described dichroic dye compound since it is possible to align the dichroic dye compound with a higher alignment degree while restraining the precipitation of the dichroic dye compound.

<Liquid Crystal Compound>

As the liquid crystal compound contained in the coloring composition, any one of a low molecular weight liquid crystal compound or a polymer liquid crystal compound can be used.

Here, the "low molecular weight liquid crystal compound" refers to a liquid crystal compound having no repeating unit in the chemical structure.

The term "polymer liquid crystal compound" refers to a liquid crystal compound having a repeating unit in the chemical structure.

Examples of the low molecular weight liquid crystal compound include compounds described in JP2013-228706A.

Examples of the polymer liquid crystal compound include thermotropic liquid crystalline polymers described in JP2011-237513A. In addition, the polymer liquid crystal compound may have a crosslinkable group (for example, an acryloyl group and a methacryloyl group) at the terminal.

<Interface Improver>

The coloring composition preferably includes an interface improver. Since the interface improver is included in the composition, it is expected to improve the smoothness of the coating surface, improve the alignment degree, suppress cissing and improve the in-plane uniformity.

As the interface improver, compounds (horizontal alignment agents) described in paragraphs [0253] to [0293] of JP2011-237513A can be used.

In a case where the coloring composition contains an interface improver, the content of the interface improver is preferably 0.001 to 5 parts by mass, and more preferably 0.01 to 3 parts by mass with respect to a total of 100 parts by mass of the dichroic dye compound and the liquid crystal compound in the coloring composition.

<Polymerization Initiator>

The coloring composition may contain a polymerization initiator.

The polymerization initiator is not particularly limited, and a photosensitive compound, that is, a photopolymerization initiator is preferable.

As the photopolymerization initiator, various kinds of compounds can be used with no particular limitation. Examples of the photopolymerization initiator include α-carbonyl compounds, acyloin ethers, α-hydrocarbon-substituted aromatic acyloin compounds, polynuclear quinone compounds, combinations of triarylimidazole dimers and p-aminophenyl ketone, acridine and phenazine compounds, oxadiazole compounds, and acylphosphine oxide compounds.

Examples of the α-carbonyl compounds include those described in U.S. Pat. Nos. 2,367,661A and 2,367,670A. Examples of the acyloin ethers include those described in U.S. Pat. No. 2,448,828A. Examples of the α-hydrocarbon-substituted aromatic acyloin compounds include those described in U.S. Pat. No. 2,722,512A. Examples of the polynuclear quinone compounds include those described in U.S. Pat. Nos. 3,046,127A and 2,951,758A. Examples of the combinations of triarylimidazole dimers and p-aminophenyl ketone include those described in U.S. Pat. No. 3,549,367A. Examples of the acridine and phenazine compounds include those described in JP1985-105667A (JP-S60-105667A) and U.S. Pat. No. 4,239,850A. Examples of the oxadiazole compounds include those described in U.S. Pat. No. 4,212,970A. Further, examples of the acylphosphine oxide compounds include those described in JP1988-040799B (JP-S63-040799B), JP1993-029234B (JP-H5-029234B), JP1998-095788B (JP-H10-095788B), and JP1998-029997B (JP-H10-029997B).

As such a photopolymerization initiator, a commercially available product can be used, and examples thereof include IRGACURE 184, IRGACURE 907, IRGACURE 369, IRGACURE 651, IRGACURE 819, and IRGACURE OXE-01 manufactured by BASF SE.

In a case where the coloring composition forming the patterned polarizing layer 18 contains a polymerization initiator, the content of the polymerization initiator is preferably 0.01 to 30 parts by mass, and more preferably 0.1 to 15 parts by mass with respect to a total of 100 parts by mass of the dichroic dye compound and the liquid crystal compound in the coloring composition. In a case where the content of the polymerization initiator is 0.01 parts by mass or more, the curability of the patterned polarizing layer 18 is improved, and in a case where the content of the polymerization initiator is 30 parts by mass or less, the alignment of the patterned polarizing layer 18 is improved.

<Solvent>

From the viewpoint of workability and the like, the coloring composition preferably contains a solvent.

Examples of the solvent include organic solvents such as ketones, ethers, aliphatic hydrocarbons, alicyclic hydrocarbons, aromatic hydrocarbons, halogenated carbons, esters, alcohols, cellosolves, cellosolve acetates, sulfoxides, amides, and heterocyclic compounds, and water. These solvents may be used alone or in combination of two or more.

Examples of ketones include acetone, 2-butanone, methyl isobutyl ketone, cyclopentanone, and cyclohexanone. Examples of ethers include dioxane and tetrahydrofuran. Examples of aliphatic hydrocarbons include hexane. Examples of alicyclic hydrocarbons include cyclohexane. Examples of aromatic hydrocarbons include benzene, toluene, xylene, and trimethylbenzene. Examples of halogenated carbons include dichloromethane, trichloromethane, dichloroethane, dichlorobenzene, and chlorotoluene. Examples of esters include methyl acetate, ethyl acetate, and butyl acetate. Examples of alcohols include ethanol, isopropanol, butanol, and cyclohexanol. Examples of cellosolves include methyl cellosolve, ethyl cellosolve, and 1,2-dimethoxyethane. Examples of sulfoxides include dimethyl sulfoxide. Examples of amides include dimethylformamide and dimethylacetamide. Examples of heterocyclic compounds include pyridine.

Among these solvents, it is preferable to use an organic solvent, and it is more preferable to use halogenated carbons or ketones.

In a case where the coloring composition contains a solvent, the content of the solvent is preferably 80% to 99% by mass, more preferably 83% to 97% by mass, and even more preferably 85% to 95% by mass with respect to the total mass of the coloring composition.

<Other Components>

The coloring composition may further contain a dichroic dye compound other than the above-described specific dichroic dye compound, or may contain a plurality of the specific dichroic dye compounds. In a case where a plurality of the dichroic dye compounds are contained, from the viewpoint of further curing the coloring composition, it is preferable that a dichroic dye compound having a crosslinking group that crosslinks with the specific dichroic dye compound described above is contained, and it is more preferable that a plurality of the specific dichroic dye compounds are contained.

The thickness of the patterned polarizing layer 18 is not limited, and the thickness that can obtain the required polarization properties may be set appropriately according to the forming material and the like.

The thickness of the patterned polarizing layer 18 is preferably 0.1 to 5 μm, and more preferably 0.3 to 1.5 μm.

As will be described later, in a case where the patterned polarizing layer 18 has a step (thickness distribution), the above-mentioned thickness is the thickness at the thickest place.

<Method for Forming Patterned Polarizing Layer>

There is no limitation on the method for forming the patterned polarizing layer 18 using the coloring composition described above, and various known film forming methods using the coloring composition can be used.

As the method for forming the patterned polarizing layer 18, as an example, a method including a step of applying the above-described coloring composition onto the support 16 to form a coating film, and a step of aligning a liquid crystal compound included in the coating film in this order may be used. In the following description, the step of applying the coloring composition onto the support 16 to form a coating film is also referred to as "coating film forming step". The step of aligning the liquid crystal compound included in the coating film is also referred to as "alignment step".

The liquid crystal compound is a component that includes not only the above-mentioned liquid crystal compound but also a dichroic dye compound having liquid crystallinity in a case where the above-mentioned dichroic dye compound has liquid crystallinity.

Here, in the display device 10 according to the embodiment of the present invention, the patterned polarizing layer 18 of the polarizing plate 20 has the region 18A having a polarization degree of less than 80% and the region 18B having a polarization degree of 80% or more.

As described above, in the display device 10 according to the embodiment of the present invention, the position of the region 18A corresponds to the position of the light emitting element of the EL substrate 12. Therefore, in the patterned polarizing layer 18, the regions 18A and 18B are formed in a pattern in which the position of the region 18A corresponds to the position of the light emitting element. The formation of this pattern will be described in detail later.

<Coating Film Forming Step>

The coating film forming step is a step of forming a coating film by applying the coloring composition to the support 16.

By using a coloring composition containing the above-described solvent, or a liquid material such as a molten liquid obtained by heating the coloring composition or the like, the coloring composition is easily applied to the support 16.

Specific examples of the method for applying the coloring composition include known methods such as a roll coating method, a gravure printing method, a spin coating method, a wire bar coating method, an extrusion coating method, a direct gravure coating method, a reverse gravure coating method, a die-coating method, a spray method, and an ink jet method.

In this example, an example has been given in which the coloring composition is applied to the support 16, but the present invention is not limited thereto. For example, the coloring composition may be applied to an alignment film provided on the support 16. The alignment film will be described later.

Further, since two or more regions having different polarization degrees, that is, the region 18A and the region 18B, are formed in the plane, the patterned polarizing layer 18 may be applied after forming an uneven structure on the surface of the support 16. The polarization degree distribution in the plane can be controlled by forming coating films having different film thicknesses in the plane by using an uneven structure. This point will also be described later.

<Alignment Step>

The alignment step is a step of aligning the liquid crystal compound included in the coating film.

The alignment step may include a drying treatment. By the drying treatment, a component such as a solvent can be removed from the coating film. The drying treatment may be performed by a method of leaving the coating film for a predetermined time at room temperature (for example, natural drying), or by heating and/or air blowing.

Here, the liquid crystal compound included in the coloring composition may be aligned by the above-described coating film forming step or drying treatment. In this case, for example, in an aspect in which the coloring composition is prepared as a coating liquid including a solvent, the coating film is dried to remove the solvent from the coating film, and thus a polarizing layer is obtained.

In a case where the drying treatment is performed at a temperature equal to or higher than the transition temperature of the liquid crystal compound included in the coating film to a liquid crystalline phase, a heating treatment to be described below may not be performed.

The transition temperature of the liquid crystal compound included in the coating film to a liquid crystalline phase is preferably 10° C. to 250° C., and more preferably 25° C. to 190 C from the viewpoint of manufacturing suitability or the like. In a case where the transition temperature is 10° C. or higher, a cooling treatment or the like for lowering the temperature to a temperature range in which the liquid crystalline phase appears is not required, and thus this case is preferable. In addition, in a case where the transition temperature is 250° C. or lower, high temperature is not required even in a case of transition to an isotropic liquid state at a temperature much higher than the temperature range in which the liquid crystalline phase once appears, and wasting of thermal energy and deformation and deterioration of the substrate can thus be reduced. Thus, this case is preferable.

The alignment step preferably includes a heating treatment. By performing the heating treatment, the liquid crystal compound included in the coating film can be aligned, and thus the coating film after the heating treatment can be suitably used as a polarizing layer.

The temperature and time of the heating treatment are not limited, and the treatment temperature and time at which the liquid crystal compound can be suitably aligned may be appropriately set according to the liquid crystal compound, the dichroic dye, and the like contained in the coating film. The temperature of the heating treatment is preferably 10° C. to 250° C., and more preferably 25° C. to 190° C. from the viewpoint of manufacturing suitability and the like. In addition, the heating time is preferably 1 to 300 seconds, and more preferably 1 to 60 seconds.

The alignment step may include a cooling treatment performed after the heating treatment. The cooling treatment is a treatment of cooling the coating film after heating to about room temperature (about 20° C. to 25° C.). Thus, the alignment of the liquid crystal compound included in the coating film can be fixed.

The method for the cooling treatment is not limited, and various known methods for cooling a sheet-like material can be used.

The patterned polarizing layer 18 having the regions 18A and 18B having different polarization degrees in the plane can be formed by combining the above-described steps with a pattern forming method described later.

In the above examples, as the method for aligning the liquid crystal compound included in the coating film, a drying treatment and a heating treatment are mentioned, but in the present invention, the method for aligning the liquid crystal compound is not limited thereto. A known alignment treatment can be carried out.

<Curing Steps>

The formation of the patterned polarizing layer 18 may include a curing step of curing the patterned polarizing layer 18 after the above-described alignment step.

The curing step is performed by heating and/or light irradiation (exposure) in a case where the patterned polarizing layer 18 has a crosslinkable group (polymerizable group), for example. Of these, the curing step is preferably performed by light irradiation.

As the light source used for curing, various light sources such as infrared rays, visible light, and ultraviolet rays can be used, and ultraviolet rays are preferable. In addition, ultraviolet rays may be applied while heating is performed at the time of curing, or ultraviolet rays may be applied through a filter that transmits only a specific wavelength.

In a case where ultraviolet rays are applied while heating is performed, the heating temperature is not limited and may be appropriately set according to the transition temperature of the liquid crystal compound included in the patterned polarizing layer 18 (coating film=coloring composition) to a liquid crystalline phase or the like. The heating temperature is preferably 25° C. to 140° C.

In addition, the light irradiation in the curing step may be performed under a nitrogen atmosphere. In a case where the patterned polarizing layer 18 is cured by radical polymerization, the inhibition of the polymerization by oxygen is reduced, and thus the light irradiation is preferably performed under a nitrogen atmosphere.

<Pattern Forming Method>

As described above, in the display device 10 according to the embodiment of the present invention, in the patterned polarizing layer 18, the region 18A (region A) having a polarization degree of less than 80% and the region 18B (region B) having a polarization degree of 80% or more are formed in a pattern.

The method for forming the patterned polarizing layer 18 having two or more regions having different polarization degrees in the plane in this manner is not limited, and various known methods can be used. As an example, a method for controlling the thickness of the patterned polarizing layer 18 in the plane, a method for unevenly distributing the dichroic dye compound in the patterned polarizing layer 18, a method for post-processing the optically uniform patterned polarizing layer 18, and the like can be used.

As the method for controlling the thickness of the patterned polarizing layer 18 in the plane, a method using lithography, a method using imprinting, and a method for forming a patterned polarizing layer on a base material having an uneven structure may be used. As the method for unevenly distributing the dichroic dye compound in the patterned polarizing layer 18, a method for extracting the dichroic dye by immersion in a solvent (bleaching) may be used. Further, as the method for post-processing the optically uniform patterned polarizing layer 18, a method for cutting a part of a flat polarizing layer by laser processing or the like may be used.

Among these, in order to form a pattern of several tens of μm to several mm according to the arrangement of the light emitting elements of the EL substrate 12, a method for controlling the thickness of the patterned polarizing layer 18 is preferable, and particularly, a method using lithography and a method for forming a patterned polarizing layer on a base material having an uneven structure are suitably used.

<<Formation of Patterned Polarizing Layer by Lithography>>

Figure 7:
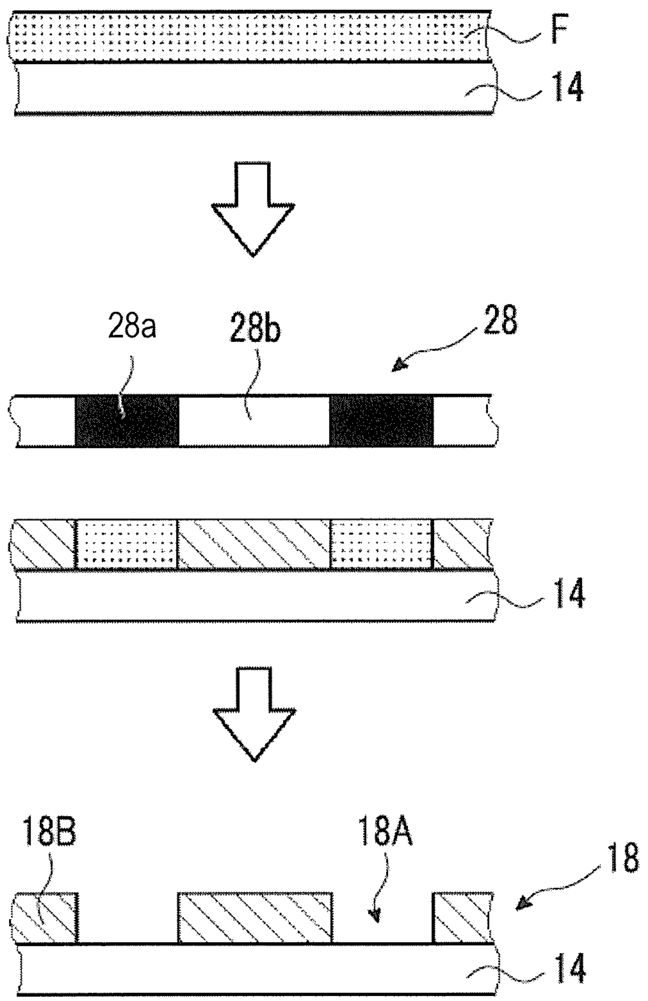
FIG. 7 is a conceptual view for illustrating an example of a method for forming a patterned polarizing layer.

FIG. 7 shows an example of a method for forming the patterned polarizing layer 18 using lithography.

In a case of forming the patterned polarizing layer 18 using lithography, first, as described above, a coating film F of the coloring composition is formed on the surface of the support 16 by the coating film forming step. Next, the liquid crystal composition in the coating film F is aligned by the alignment step (first view in FIG. 7).

Then, a curing step of curing the coating film F by light irradiation is performed. Here, the light irradiation at this time is performed by pattern exposure through a mask 28 having a pattern of a light shielding part 28*a* and a light transmission part 28*b* as shown in the second view of FIG. 7. The light shielding part 28*a* and the light transmission part 28*b* of the mask 28 are provided in a pattern in which the light shielding part 28*a* corresponds to the region 18A of the patterned polarizing layer 18 and the light transmission part 28*b* corresponds to the region 18B of the patterned polarizing layer 18.

In a case of forming the patterned polarizing layer 18 using lithography, a developing step is performed after exposure. In the developing step, a region which is not cured by the curing step due to light shielded by the light shielding part 28*a* of the mask 28, that is, a region corresponding to the region 18A of the patterned polarizing layer 18 of the coating film is removed.

The developing step is usually performed with a solvent. That is, by immersing the cured coating film in a solvent or spraying a solvent on the cured coating film, the liquid crystal compound in the uncured region which is not polymerized is dissolved in the solvent to perform development. Thus, the region of the coating film corresponding to the region 18A of the patterned polarizing layer 18 is removed to form the patterned polarizing layer 18 having the regions 18A and 18B as shown in the third view of FIG. 7.

In this example, there is no polarizing layer in the region 18A, and thus the polarization degree of the region 18A is 0%. Thus, the patterned polarizing layer 18 having the region 18A having a polarization degree of less than 80% and the region 18B having a polarization degree of 80% or more can be formed.

The thickness of the region 18B may be appropriately set according to the material for forming the patterned polarizing layer 18 and the like such that the polarization degree of the region 18B has a target value of 80% or more. In this regard, the other examples are similar.

<<Formation of Patterned Polarizing Layer by Imprinting>>

Figure 8:
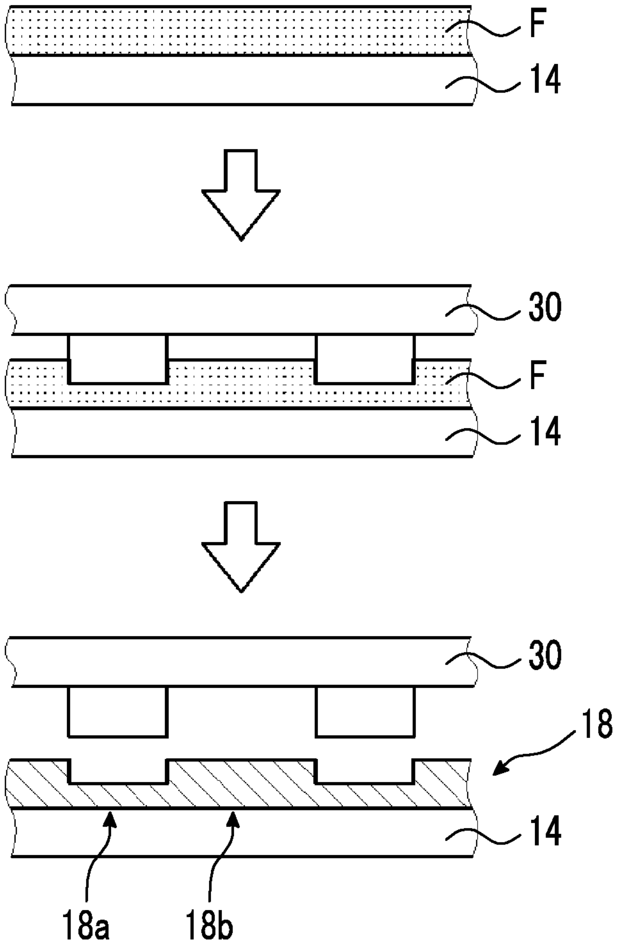
FIG. 8 is a conceptual view for illustrating another example of the method for forming the patterned polarizing layer.

FIG. 8 shows an example of the method for forming the patterned polarizing layer 18 using imprinting.

In a case of forming the patterned polarizing layer 18 using imprinting, first, a coating film F of the coloring composition is formed on the surface of the support 16 by the coating film forming step as described above (first view in FIG. 8).

Next, as shown in the second view of FIG. 8, the coating film F is pressed by a pressing die 30 having unevenness. The unevenness of the pressing die 30 is formed in a pattern in which the convex portion corresponds to the region 18A of the patterned polarizing layer 18 and the concave portion corresponds to the region 18B of the patterned polarizing layer 18.

Next, in a state where the coating film F is pressed by the pressing die 30, the alignment step and the curing step are performed as described above to prepare the patterned polarizing layer 18. Finally, as shown in the third view of FIG. 8, the pressing die is removed.

As a result, the patterned polarizing layer 18 having an uneven pattern corresponding to the unevenness of the pressing die 30 is formed. Here, since the patterned polarizing layer 18 is thin, the concave portion of the patterned polarizing layer 18 has a small amount of dye and a low polarization degree. In contrast, the convex portion of the patterned polarizing layer 18 has a large amount of dye and a high polarization degree since the patterned polarizing layer 18 is thick.

Thus, the patterned polarizing layer 18 having the region 18A having a polarization degree of less than 80% and the region 18B having a polarization degree of 80% or more can be formed. The thickness of the region 18A may be appropriately set according to the material for forming the patterned polarizing layer 18 and the like such that the polarization degree of the region 18A is a target value of less than 80%. In this regard, the same applies to other examples.

<<Formation of Patterned Polarizing Layer Using Base Material Having Uneven Structure>>

Figure 9:
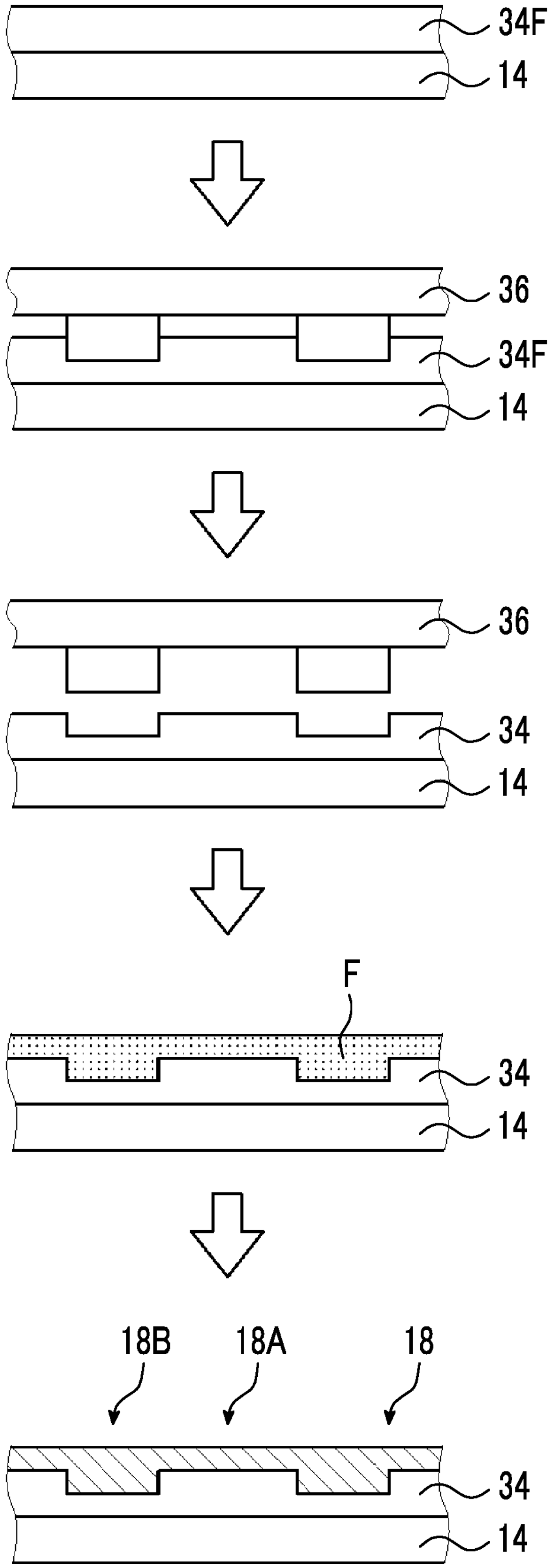
FIG. 9 is a conceptual view for illustrating still another example of the method for forming the patterned polarizing layer.

FIG. 9 shows an example of a method of forming the patterned polarizing layer 18 using a base material having an uneven structure.

In a case where the patterned polarizing layer 18 is formed using a base material having an uneven structure, first, as shown in the first view of FIG. 9, a coating film 34F of a composition containing a material to become a base material 34 having an uneven structure is formed on the surface of the support 16.

As the base material 34 having an uneven structure, it is preferable to form a resin layer using a curable compound such as a (meth)acrylate compound and an epoxy compound. The base material 34 preferably has a low retardation (Re). In addition, in a case where the retardation of the base material 34 is high, it is preferable that the display device 10 is configured such that the λ/4 wavelength plate 14 is positioned on a side of the support 16 opposite to the base material 34.

The composition containing the material to become the base material 34 may be a known composition which contains a monomer of these resins, a polymerization initiator, a solvent and the like and is formed into a film by a coating method.

Next, as shown in the second view of FIG. 9, the coating film 34F is pressed by a pressing die 36 having unevenness. The unevenness of the pressing die 30 is formed in a pattern in which the concave portion corresponds to the region 18A of the patterned polarizing layer 18 and the convex portion corresponds to the region 18B of the patterned polarizing layer 18.

Thereafter, in a state in which the coating film 34F is pressed by the pressing die 36, the coating film 34F is cured by a curing method according to the composition such as drying and irradiation with ultraviolet rays, and the base material 34 having an uneven structure is formed as shown in a third view of FIG. 9. Accordingly, in the uneven structure of the base material, the convex portion corresponds to the region 18A of the patterned polarizing layer 18, and the concave portion corresponds to the region 18B of the patterned polarizing layer 18.

Then, as shown in the fourth view of FIG. 9, the coating film F is formed on the base material 34 having the uneven structure by the coating film forming step, and the alignment step and the curing step are further performed to prepare the patterned polarizing layer 18.

Thus, the patterned polarizing layer 18 having the uneven structure of the base material 34, that is, the uneven pattern corresponding to the unevenness of the pressing die 36 is formed. Here, since the patterned polarizing layer 18 is thin, the concave portion of the patterned polarizing layer 18 has a small amount of dye and a low polarization degree. In contrast, the convex portion of the patterned polarizing layer 18 has a large amount of dye and a high polarization degree since the patterned polarizing layer 18 is thick.

Thus, the patterned polarizing layer 18 having the region 18A having a polarization degree of less than 80% and the region 18B having a polarization degree of 80% or more can be formed. In addition, in this forming method, the patterned polarizing layer 18 has unevenness, but the surface of the polarizing plate 20 can be made flat.

The surface of the polarizing plate 20 is preferably flat considering the ease of lamination with other layers. By making the surface of the polarizing plate 20 flat, it is possible to prevent bubbles generated during lamination with another layer.

Here, in the formation of the patterned polarizing layer 18 by imprinting and the formation of the patterned polarizing layer 18 using a base material having an uneven structure, the polarization degree in the plane may be changed in the region 18A and/or the region 18B according to the shape of the side wall of the convex portion of the pressing die or the like. Thus, the patterned polarizing layer 18 having a region provided in a region close to the region 18B in the region 18A and having a high polarization degree in comparison with a region spaced from the region 18B is obtained. Alternatively, the patterned polarizing layer 18 having a region provided in a region closer to the region 18A in the region 18B and having a low polarization degree in comparison with a region spaced from the region 18A is obtained. Alternatively, the patterned polarizing layer 18 having a region provided in a region close to the region 18B in the region 18A and having a high polarization degree in comparison with a region spaced from the region 18B, and a region provided in a region close to the region 18A in the region 18B and having a low polarization degree in comparison with a region spaced from the region 18A is obtained.

Further, the shape of the side wall of the convex portion of the pressing die may be an inclined surface. Thus, the patterned polarizing layer 18 can be prepared in which the region 18A has a region in which the polarization degree is gradually increased toward the region 18B in the vicinity of the end portion by continuously changing the polarization degree in the plane in the region 18A. Alternatively, in this manner, the patterned polarizing layer 18 can be prepared in which the region 18B has a region in which the polarization degree is gradually decreased toward the region 18A in the vicinity of the end portion by continuously changing the polarization degree in the plane in the region 18B. Alternatively, the patterned polarizing layer 18 can be prepared in which the region 18A has a region in which the polarization degree is gradually increased toward the region 18B in the vicinity of the end portion, and the region 18B has a region in which the polarization degree is gradually decreased toward the region 18A in the vicinity of the end portion by continuously changing the polarization degree in the plane in the regions 18A and 18B.

<Alignment Film>

As described above, in the display device 10 according to the embodiment of the present invention, the polarizing plate 20 has the support 16 and the patterned polarizing layer 18, but in order to align the liquid crystal compound in the patterned polarizing layer 18, an alignment film may be provided between the support 16 and the patterned polarizing layer 18.

Examples of the method for forming the alignment film include a rubbing treatment for a film surface using an organic compound (preferably a polymer), oblique deposition of an inorganic compound, formation of a layer having microgrooves, and accumulation of an organic compound according to a Langmuir-Blodgett method (LB film). Examples of organic compounds that is accumulated according to the Langmuir-Blodgett method include co-tricosanoic acid, dioctadecylmethylammonium chloride, and methyl stearylate. Further, there are known alignment films having an alignment function imparted thereto by applying an electrical field, applying a magnetic field, or light irradiation.

Among these, in the present invention, an alignment film formed by a rubbing treatment is preferable in view of easy control of a pretilt angle of the alignment film, and a photo alignment film Ruined by light irradiation is also preferable in view of alignment uniformity.

<<Rubbed Alignment Film>>

The polymer material used for an alignment film formed by a rubbing treatment is described in many literatures, and many commercially available products are available.

In the present invention, polyvinyl alcohol, polyimide, and derivatives thereof can be preferably used. Regarding the alignment film, the description in the 24th line on page 43 to 8th line on page 49 in WO2001/088574A can be referred to.

<<Photo Alignment Film>>

The photo alignment compound used for an alignment film formed by light irradiation is described in many literatures.

In the present invention, preferable examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadimide compounds having photo alignment units described in JP2002-265541A and JP2002-317013A, photocrosslinkable silane derivatives described in JP4205195B and JP4205198B, and photocrosslinkable polyimides, polyamides, and esters described in JP2003-520878A, JP2004-529220A, and JP4162850B. Azo compounds, photocrosslinkable polyimides, polyamides, esters, and the like are more preferable.

Among these, a photosensitive compound having a photoreactive group which generates at least one of dimerization or isomerization by the action of light is preferably used as the photo alignment compound.

In addition, the photoreactive group preferably has a skeleton of at least one derivative or compound selected from the group consisting of a cinnamic acid derivative, a coumarin derivative, a chalcone derivative, a maleimide derivative, an azobenzene compound, a polyimide compound, a stilbene compound, and a spiropyran compound.

Linearly polarized light or unpolarized light is applied to a photo alignment film formed from the above-described material to manufacture a photo alignment film.

In this specification, the "linearly polarized light irradiation" and the "unpolarized light irradiation" are operations for causing a photoreaction to the photo alignment material. The wavelength of the light used varies depending on the photo alignment material used and is not particularly limited as long as the wavelength is a wavelength required for the photoreaction. The peak wavelength of the light used for light irradiation is preferably 200 nm to 700 nm, and ultraviolet light having a light peak wavelength of 400 nm or less is more preferable.

The light source used for light irradiation is a usually used light source, and examples thereof include lamps such as a tungsten lamp, a halogen lamp, a xenon lamp, a xenon flash lamp, a mercury lamp, a mercury xenon lamp, and a carbon arc lamp, various lasers, light emitting diodes, and cathode ray tubes. Examples of lasers include a semiconductor laser, a helium neon laser, an argon ion laser, a helium cadmium laser, and an yttrium aluminum garnet (YAG) lasers.

As a method for obtaining linearly polarized light, a method using a polarizing plate, a method using a prism-based element, or a reflective type polarizer using a BREWSTER angle, or a method using light emitted from a polarized laser light source can be employed. Examples of the polarizing plate include an iodine polarizing plate, a dichroic dye polarizing plate, and a wire grid polarizing plate. An example of the prism-based element is a GLAN-THOMSON prism.

In addition, only light having a required wavelength may be selectively applied by using a filter, a wavelength conversion element, or the like.

In a case where linearly polarized light is used as for a method of light irradiation, a method of irradiating the alignment film with light from an upper surface or a rear surface to the alignment film in a direction vertical or oblique to the alignment film surface is employed. Although the incidence angle of the light varies depending on the photo alignment material, the incidence angle is preferably 0° to 90° (vertical), and preferably 40° to 90°.

In a case where unpolarized light is used, the alignment film is irradiated with unpolarized light from an oblique direction. The incidence angle of the light is preferably 10° to 80°, more preferably 20° to 60°, and even more preferably 30° to 50°.

The irradiation time is preferably 1 minute to 60 minutes, and more preferably 1 minute to 10 minutes.

The thickness of the alignment film is preferably 0.01 to 10 μm, and more preferably 0.01 to 1 μm.

<Transparent Resin Layer>

The polarizing plate 20 may have a transparent resin layer on the surface of the patterned polarizing layer 18.

It is preferable to provide the transparent resin layer on the surface of the patterned polarizing layer 18 since the surface of the patterned polarizing layer 18 (polarizing plate 20) can be made flat and the patterned polarizing layer 18 can be protected from moisture and the like.

The transparent resin layer may be a layer containing a polymer (hereinafter, also abbreviated as "specific polymer") having a hydrophilic group and not having a glass transition temperature (Tg) in a temperature range of 95° C. or lower.

Here, the hydrophilic group is a monovalent or divalent group, and examples thereof include an amide group, a hydroxy group, a urethane group (urethane bond), a polyoxyalkylene group, an amino group, a carboxyl group, an alkali metal salt of the carboxyl group, an alkoxy group, a carbamoyl group, a sulfonamide group, a sulfamoyl group, a sulfonic group, and an alkali metal salt of the sulfonic group. Examples of the polyoxyalkylene group include a polyoxyethylene group, a polyoxypropylene group, and a polyoxyalkylene group in which an oxyethylene group and an oxypropylene group are blocked-bonded or randomly bonded.

The presence and identification of the hydrophilic group of the specific polymer in the transparent resin layer can be determined by performing measurement by total reflection infrared spectroscopy (ATR-IR) using a Fourier transform infrared spectrometer with a diamond crystal as a prism and incidence (single reflection) at 45 degrees. As the Fourier transform infrared spectrometer, for example, Nicolet iS5 FT-IR, manufactured by Thermo Fisher Scientific Inc. may be used.

On the other hand, the glass transition temperature (Tg) refers to an average of a temperature at which a measured temperature when the temperature is raised at a temperature rising rate of 10° C./min using a differential scanning calorimeter (DSC) starts to change from the baseline and a temperature at which the measured temperature returns to the baseline.

In the present invention, as an example, the glass transition temperature may be obtained by using the transparent resin layer cut out from the laminate as an evaluation sample, weighing about 2 mg of the evaluation sample subjected to vacuum drying on an aluminum pan using a differential scanning calorimeter (DSC) Q2000 manufactured by TA Instruments, Inc., and setting the aluminum pan in a DSC measurement holder to obtain Tg from an Inflection point when the temperature is raised from 10° C. to 300° C. at 2° C./min.

The main chain structure of the specific polymer is not particularly limited as long as the polymer does not have a glass transition temperature in a temperature range of 95° C. or lower, and examples thereof include polyacrylate, polymethacrylate, polyacrylamide, polystyrene, polyester, polyamide, polyimide, polyurethane, and polyurea.

In the present invention, the content of the specific polymer in the transparent resin layer is preferably 30% by mass or more, more preferably 40% by mass or more, and even more preferably 50% to 98% by mass with respect to the total mass of the total solid content of the transparent resin layer.

In the present invention, the specific polymer is preferably a polymer in which the ratio of the number of hydrophilic groups to the number of carbon atoms having a C—H bond is 0.05 to 0.45.

Here, regarding the ratio of the number of hydrophilic groups to the number of carbon atoms having a C—H bond, in a case where the molecular structure of a monomer (hydrophilic monomer described later) having a hydrophilic group for obtaining a specific polymer from a polymerization reaction can be identified, the ratio of the number of hydrophilic groups to the number of carbon atoms having a C—H bond in the molecular structure can be determined as it is. On the other hand, in a case where the monomer is unknown, an absorption spectrum with a lateral axis indicating a wave number is obtained by total reflection infrared spectroscopy using a Fourier transform infrared spectral device, and then the ratio of the number of hydrophilic groups to the number of carbon atoms having a C—H bond can be calculated from a peak surface area derived from the hydrophilic group of the specific polymer and a peak surface area derived from the C—H bond.

In the present invention, the water contact angle of a surface of the transparent resin layer opposite to the patterned polarizing layer 18 is preferably 25° to 60°, more preferably 25° to 50°, and even more preferably 25° to 40° since the high temperature durability and the moisture-heat resistance of the laminate are improved.

Here, the water contact angle is obtained as follows: after humidity conditioning of the transparent resin layer for 2 hours or longer at 25° C. and a relative humidity of 60%, 1.7 μL of water is left on a surface of the measurement target held horizontally, and the water contact angle is obtained from an angle formed between the surface and the water droplet after 20 seconds. The water contact angle may be measured using, for example, a surface contact angle measuring device (FACE CONTACT-ANGLE METER CA-A) manufactured by Kyowa Interface Science Co., Ltd.

In the present invention, there is no limitation on the thickness of the transparent resin layer, and the thickness may be appropriately set according to the material for forming the transparent resin layer and the like such that the required performance can be exhibited.

The thickness of the transparent resin layer is preferably 0.1 to 10 urn, and more preferably 0.5 to 5 μm.

<Pressure Sensitive Adhesive Layer>

As described above, since the display device 10 according to the embodiment of the present invention has the circularly polarizing plate consisting of the λ/4 wavelength plate 14 and the polarizing plate 20 having the patterned polarizing layer 18, the reflection of external light is prevented.

The λ/4 wavelength plate 14 and the polarizing plate 20 may be laminated by a pressure sensitive adhesive layer.

Examples of the pressure sensitive adhesive included in the pressure sensitive adhesive layer include rubber-based pressure sensitive adhesives, acrylic pressure sensitive adhesives, silicone-based pressure sensitive adhesives, urethane-based pressure sensitive adhesives, vinyl alkyl ether-based pressure sensitive adhesives, polyvinyl alcohol-based pressure sensitive adhesives, polyvinylpyrrolidone-based pressure sensitive adhesives, polyacrylamide-based pressure sensitive adhesives, and cellulose-based pressure sensitive adhesives.

Among these, acrylic pressure sensitive adhesives (pressure sensitive adhesives) are preferable from the viewpoints of transparency, weather fastness, heat resistance, and the like.

The pressure sensitive adhesive layer can be formed by, for example, a method in which a pressure sensitive adhesive solution is applied to a peeling sheet, dried, and then transferred to the surface of the transparent resin layer; a method in which a pressure sensitive adhesive solution is directly applied to the surface of the transparent resin layer and dried; or the like.

The pressure sensitive adhesive solution is prepared as, for example, a solution of about 10% to 40% by mass of a pressure sensitive adhesive dissolved or dispersed in a solvent such as toluene or ethyl acetate.

As an application method, a roll coating method such as reverse coating or gravure coating, a spin coating method, a screen coating method, a fountain coating method, a dipping method, a spray method, or the like can be used.

Examples of the material constituting the peeling sheet include appropriate thin sheet-like materials such as a synthetic resin film such as polyethylene, polypropylene, and polyethylene terephthalate; a rubber sheet; paper; cloth; non-woven fabric; net; a foamed sheet; and metallic foil.

In the present invention, the thickness of the pressure sensitive adhesive layer is not particularly limited, and the thickness at which required pressure sensitive adhesiveness is obtained may be appropriately set according to the kind of the pressure sensitive adhesive.

The thickness of the pressure sensitive adhesive layer is preferably 3 to 50 μm, more preferably 4 to 40 μm, and even more preferably 5 to 30 μm.

In the display device 10 according to the embodiment of the present invention, the thickness of the polarizing plate 20 is not limited and may be appropriately set according to the configuration of the polarizing plate, the material for forming the polarizing plate, and the like. The thickness of the polarizing plate 20 is preferably 1 to 100 μm, more preferably 1 to 30 μm, and even more preferably 1 to 10 μm.

Here, in the display device 10 according to the embodiment of the present invention, the total thickness of the λ/4 wavelength plate 14 and the polarizing plate 20 described above is preferably 20 μm or less.

By setting the total thickness of the λ/4 wavelength plate 14 and the polarizing plate 20 to 20 μm or less, the EL substrate 12 and the patterned polarizing layer 18 are brought close to each other, and the angle of view from the light emitting element to the region A is increased. As a result, the utilization efficiency of light emitted from the light emitting element can be improved.

The polarizing plate 20 in the shown example has a configuration in which the patterned polarizing layer 18 is formed on the surface of the support 16, but the present invention is not limited thereto.

As an example, the polarizing plate 20 may not have the support 16 and the patterned polarizing layer 18 and the like may be directly formed on the λ/4 wavelength plate 14. That is, the display device according to the embodiment of the present invention may have a configuration in which the polarizing plate 20 is formed of only the patterned polarizing layer 18. Alternatively, the alignment film may be formed on the λ/4 wavelength plate 14 and the patterned polarizing layer 18 may be formed on the surface thereof.

With such a configuration, the total thickness of the λ/4 wavelength plate 14 and the polarizing plate 20 can be preferably 20 μm or less.

As described above, in the display device 10 according to the embodiment of the present invention, the position of the region A, which is a region having a low polarization degree (less than 80%) in the polarizing plate 20, and the position of the light emitting element in the EL substrate 12 correspond to each other.

Here, in the display device 10 according to the embodiment of the present invention, in a case where an area ratio of the region 18A in the patterned polarizing layer 18 is SA % and an area ratio of the light emitting elements in the EL substrate 12 is SP %, it is preferable to satisfy 0.5≤SA/SP, and SA<50%.

In a case where the polarizing plate 20 and the EL substrate 12 satisfy "0.5≤SA/SP" and "SA<50%", both improvement in utilization efficiency of light emitted from the light emitting element and a function of preventing reflection of external light can be achieved.

In the display device 10 according to the embodiment of the present invention, 0.8≤SA/SP is more preferable, and 1.0≤SA/SP is even more preferable.

In addition, SA<30% is more preferable, and SA<20% is even more preferable. That is, it is more preferable that SA/SP and SA satisfy these ranges.

In the display device 10 according to the embodiment of the present invention, a distance L between the light emitting element of the EL substrate 12 and the patterned polarizing layer 18 is preferably shorter than a pitch p of the light emitting elements on the EL substrate 12 (refer to FIGS. 1 and 5). The pitch p of the light emitting elements on the EL substrate 12 is a distance between the centers of the light emitting elements.

In the display device 10 according to the embodiment of the present invention, since the display device 10 is suitably viewed even from an oblique visual field, the light emitted from the light emitting element of the EL substrate 12 includes light emitted obliquely with respect to the normal line of the light emission surface. Accordingly, by making the distance L between the light emitting element of the EL substrate 12 and the patterned polarizing layer 18 shorter than the pitch p of the light emitting elements, even in a case where the area of the region A is decreased and the area of the region B is increased, the light emitted from the light emitting elements can be made incident on the region A. As a result, it is possible to more suitably achieve both the utilization efficiency of light emitted from the light emitting elements of the EL substrate 12 and the reflection prevention function.

The distance L between the light emitting element and the patterned polarizing layer 18 is more preferably 80% or less of the pitch p of the light emitting elements, even preferably 50% or less of the pitch p, and still even preferably 20% or less of the pitch p.

The display device 10 according to the embodiment of the present invention may have a light shielding layer having an opening portion corresponding to the light emitting element between the EL substrate 12 and the patterned polarizing layer 18.

By providing such a light shielding part, it is possible to enhance a function of preventing reflection of external light without impairing the utilization efficiency of light emitted from the light emitting element.

The light shielding layer is preferably a resin layer including a known black material typified by carbon black.

<Surface Layer>

The display device 10 according to the embodiment of the present invention may be provided with a single surface layer or a plurality of surface layers required according to the purpose on the outermost surface. Preferable aspects include an aspect having a hard coat layer on the outermost surface, an aspect having an antireflection layer on the outermost surface, and an aspect in which a hard coat layer is laminated on the outermost surface, and an antireflection layer is further laminated on the outer side of the surface of the hard coat layer. Particularly, by providing a surface antireflection layer described below, it is possible to provide an EL display device which has more excellent visibility in a bright room environment.

<<Surface Antireflection Layer>>

The antireflection layer is a layer consisting of at least one or more layers designed in consideration of the refractive index, the film thickness, the number of layers, the layer order, and the like so that the reflectivity is reduced by optical interference.

As a simplest configuration, the antireflection layer has a configuration in which only a layer of low refractive index is applied on the outermost surface of the film. In order to further reduce the reflectivity, it is preferable to form an antireflection layer by combining a layer of high refractive index having a high refractive index and a layer of low refractive index layer having a low refractive index.

As a configuration example, a configuration including two layers of a layer of high refractive index and a layer of low refractive index in order from the lower side, and a configuration having three layers having different refractive indexes in which a layer of intermediate refractive index, a layer of high refractive index, and a layer of low refractive index are laminated in this order may be adopted, and it is also proposed that more antireflection layers are laminated. The layer of intermediate refractive index is a layer having a refractive index which is higher than that of an underlayer and is lower than that of a layer of high refractive index.

Among these, from the viewpoint of durability, optical properties, costs, productivity, and the like, a configuration in which a layer of intermediate refractive index, a layer of high refractive index, and a layer of low refractive index are provided on a hard coat layer in this order is preferable and examples of the configuration include configurations described in JP1996-122504A (JP-H08-122504A), JP1996-110401A (JP-H08-110401A), JP1998-300902A (JP-H10-300902A), JP2002-243906A, JP2000-111706A, and the like.

In addition, an antireflection film having a three layer configuration, which has excellent robustness with respect to a variation in film thickness, is described in JP2008-262187A. In a case where the antireflection film having a three layer configuration described above is placed on the surface of an image display device, it is possible to set an average value of reflectivity to 0.5% or less, to considerably reduce reflected glare, and to obtain an image having excellent stereoscopic effects.

In addition, other functions may be imparted to each layer. Examples thereof include a layer of low refractive index having antifouling properties, a layer of high refractive index having antistatic properties, a hard coat layer having antistatic properties, and a hard coat layer having antiglare properties described in JP1998-206603A (JP-H10-206603A), JP2002-243906A, JP2007-264113A, and the like.

An example of a specific layer configuration of a case of having a hard coat layer and an antireflection layer is shown below. In the following notation, -*/ represents a base material on which the surface layer is laminated. Specifically, -*/ represents the polarizing plate 20 having the patterned polarizing layer 18 and any layer arranged on the viewing side thereof.

-*/Hard coat layer
-*/Layer of low refractive index
-*/Antiglare layer/layer of low refractive index
-*/Hard coat layer/layer of low refractive index
-*/Hard coat layer/antiglare layer/layer of low refractive index
-*/Hard coat layer/layer of high refractive index/layer of low refractive index
-*/Hard coat layer/layer of intermediate refractive index/layer of high refractive index/layer of low refractive index
-*/Hard coat layer/antiglare layer/layer of high refractive index/layer of low refractive index
-*/Hard coat layer/antiglare layer/layer of intermediate refractive index/layer of high refractive index/layer of low refractive index
-*/Antiglare layer/layer of high refractive index/layer of low refractive index
-*/Antiglare layer/layer of intermediate refractive index/layer of high refractive index/layer of low refractive index Although the EL display device according to the embodiment of the present invention has been described above in detail, the present invention is not limited to the above examples, and various improvements and changes may be made without departing from the scope of the present invention.

EXAMPLES

Hereinafter, the present invention will be described in more detail based on examples. Materials, used amounts, ratios, treatment contents, treatment procedures, and the like shown in the following examples are able to be properly changed as long as the changes do not depart from the gist of the present invention. Therefore, the scope of the present invention will not be restrictively interpreted by the following examples.

[Preparation of Polarizing Plate 101]

<Preparation of Support>

An alignment film coating liquid having the following composition was continuously to a TAC base material (TG40, manufactured by Fujifilm Corporation) having a thickness of 40 μm using a #8 wire bar. Thereafter, the applied liquid was dried for 2 minutes at 100° C., and thus, a support in which a polyvinyl alcohol (PVA) alignment film having a thickness of 0.8 μm was formed on the TAC base material was obtained.

The modified polyvinyl alcohol was added to the alignment film coating liquid such that the solid content concentration was 4% by mass.

| Composition of Alignment Film Coating Liquid<br>Modified polyvinyl alcohol below | |
|---|---|
| Water | 70 parts by mass |
| Methanol | 30 parts by mass |

Modified polyvinyl alcohol

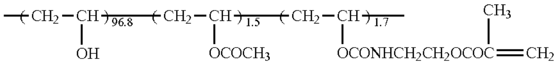

<Formation of Alignment Film>

To 1 part by mass of a photo alignment material E-1 having the following structure, 41.6 parts by mass of butoxyethanol, 41.6 parts by mass of dipropylene glycol monomethyl, and 15.8 parts by mass of pure water were added, and the obtained solution was filtered under pressure with a 0.45 μm membrane filter to prepare a coating liquid for photo alignment film.

Next, the obtained coating liquid for a photo alignment film was applied to the prepared transparent support, and dried for 1 minute at 60° C. Then, the obtained coating film was irradiated with linearly polarized ultraviolet rays (illuminance: 4.5 mW, irradiation dose: 500 mJ/$cm^2$) using a polarized ultraviolet exposure device to prepare an alignment film.

E-1

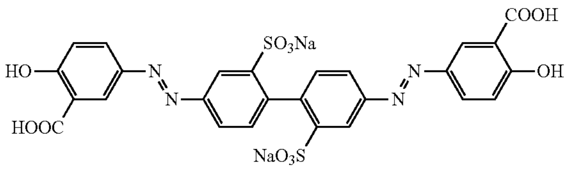

<Formation of Patterned Polarizing Layer>

The following composition for forming a polarizing layer was continuously applied to the formed alignment film with a #4 wire bar to form a coating film 1.

Next, the coating film was heated at 140° C. for 90 seconds, and the coating film 1 was cooled to room temperature (23° C.).

Then, the film was heated at 80° C. for 60 seconds, and cooled again to room temperature.

Then, irradiation was performed with light emitted from a high pressure mercury lamp via a mask under the irradiation conditions of an illuminance of 28 $mW/cm^2$ for 60 seconds to prepare a light polarizing layer having a cured region and an uncured region of a liquid crystal compound in the plane on the alignment film (refer to FIG. 7). As the mask pattern of the mask, a mask pattern having a light shielding part corresponding to the position of the light emitting element (area ratio: 25%) of the EL substrate 1 described later, and a light transmission part was used.

The film having the prepared polarizing layer having a cured region and an uncured region of the liquid crystal compound in the plane was immersed in ethanol for 3 minutes and the unpolymerized liquid crystal compound was washed and removed to form a patterned polarizing layer 01 having a region A and a region B having different polarization degrees in the plane.

House Corporation) were arranged in this order to face each other, and a measurement system that was capable of detecting the intensity of light transmitted through the sample and the analyzer among the light emitted from the light source was constructed.

The size of the sample was 100 mm square. In addition, the distance between the two-dimensional spectroradiometer and the sample was 400 mm.

For the measurement, the transmitted light intensity I (θ) was measured every 15° by the rotating analyzer method. After the measurement, the MD transmittance and the TD transmittance of the analyzer were known, and the MD transmittance and the TD transmittance of the sample were calculated. Thereafter, the polarization degree and the single

| Composition of Composition for Forming Polarizing Layer | |
|---|---|
| Yellow azo dye Y-1 below | 7.1 parts by mass |
| Cyan azo dye D-55 below | 9.1 part by mass |
| Polymer liquid crystal compound P-1 below | 101.1 parts by mass |
| Polymerization initiator IRGACURE 819 (manufactured by BASF SE) | 1.0 part by mass |
| Interface Improver F-1 below | 0.3 parts by mass |
| Cyclopentanone | 617.0 parts by mass |
| Tetrahydrofuran | 264.4 parts by mass |

Yellow azo dye Y-1

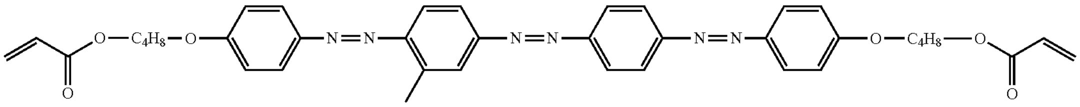

(Y-1)

Cyan azo dye D-55

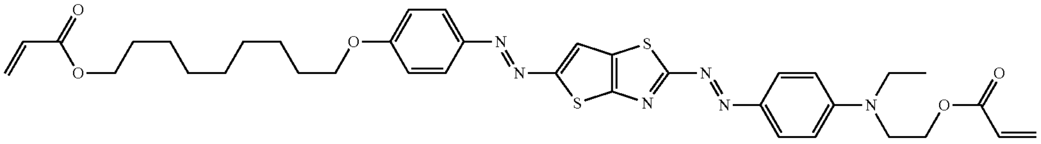

(D-55)

Polymer liquid crystal compound P-1

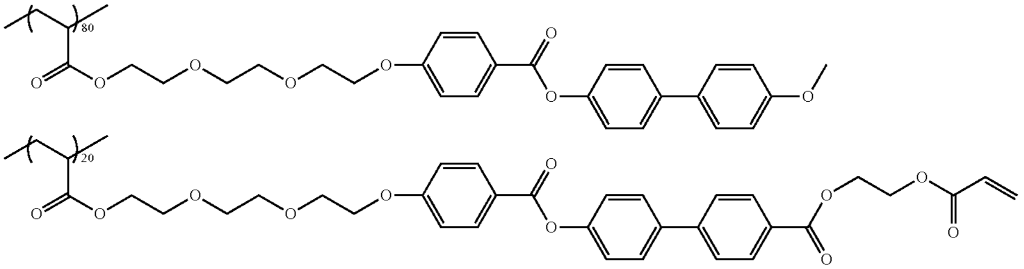

Interface improver F-1

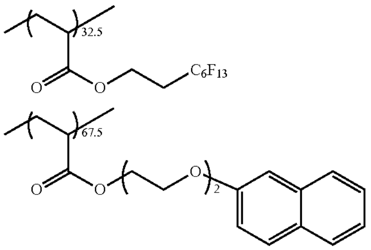

<Measurement of Polarization Degree and Transmittance>

A light source, a sample (a film having the patterned polarizing layer 01), an analyzer (POLAX-25N manufactured by Luceo Co., Ltd.), and a two-dimensional spectroradiometer (SR-5000 manufactured by Topcon Techno transmittance in a specific region of the sample were calculated by Formulae (1) and (2) above.

From the measurement results, the polarization degrees and single transmittances of the regions A and B in the patterned polarizing layer 01, and the area ratios of the regions A and B in the patterned polarizing layer 01 were calculated. The polarization degree, the single transmittance (transmittance), and the area ratio are shown in Table 1 below.

<Formation of Transparent Resin Layer>

The following curable composition 1 was continuously applied to the formed patterned polarizing layer 01 with a #2 wire bar, and dried at 60° C. for 5 minutes.

Thereafter, a curable composition 1 was cured by being irradiated with the light emitted from the high pressure mercury lamp for 60 seconds under the irradiation conditions of illuminance of 28 mW/cm$^2$ to form a transparent resin layer on the patterned polarizing layer 01, and a polarizing plate 101, which is a laminate of the transparent support, the alignment film, the patterned polarizing layer 01, and the transparent resin layer, was prepared.

The cross section of the transparent resin layer was cut using a microtome cutting machine, and the film thickness was measured with a scanning electron microscope (SEM). The film thickness of the polarizing plate 101 was about 1.2 μm in the thinnest portion.

| Curable Composition 1 | |
|---|---|
| Hydrophilic monomer HM-1 below | 29 parts by mass |
| Polymerization initiator IRGACURE 819 (manufactured by BASF SE) | 1 part by mass |
| Ethanol | 70 parts by mass |

Hydrophilic monomer HM-1

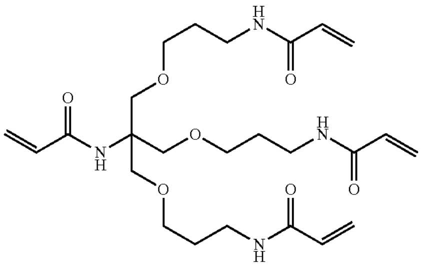

HM-1

[Preparation of Polarizing Plates 102 to 111 and 201]

Patterned polarizing layers 02 to 11 were prepared in the same manner as in the preparation of the patterned polarizing layer 01, and polarizing plates 102 to 111 were prepared in the same manner as in the preparation of the polarizing plate 101 except that the count of the wire bar used in a case of applying the composition for forming a polarizing layer and the mask pattern of the mask used in a case where the coating film of the composition for forming a polarizing layer was irradiated with light emitted from a high pressure mercury lamp were changed.

In addition, in order to measure the utilization efficiency of light of the light emitting element, which will be described later, a polarizing layer 90 was prepared in the same manner as in the preparation of the patterned polarizing layer 01 and a polarizing plate 201 was prepared in the same manner as the preparation of the polarizing plate 101 except that the light emitted from the high pressure mercury lamp was applied without passing through a mask and the immersion step in ethanol was omitted. That is, in the polarizing plate 201, the polarizing layer 90 was entirely uniformly formed and had no pattern.

The mask pattern used in a case where the patterned polarizing layer 09 (polarizing plate 109) was prepared was such that the position of the light shielding part corresponded to the position of the light emitting element (area ratio: 10%) of the EL substrate 2 described later. The mask pattern used in a case where the patterned polarizing layer 10 (polarizing plate 110) was prepared was such that the position of the light shielding part corresponded to the position of the light emitting element (area ratio: 1%) of an EL substrate 3 described later.

In the mask pattern used in a case where the patterned polarizing layer 11 (polarizing plate 111) was prepared, the position of the light shielding part was set to correspond to the position of the light emitting element (area ratio: 13.9%) of an EL substrate 4 described later.

In addition, for each of the formed patterned polarizing layers, the polarization degrees, the single transmittances (transmittances), and the area ratios of the regions A and B were calculated as in the patterned polarizing layer 01. The polarization degree, the single transmittance (transmittance), and the area ratio are collectively shown in Table 1 below. The polarizing layer 90 (polarizing plate 201) having no pattern had a polarization degree of 92% and a single transmittance of 45%.

[Preparation of Polarizing Plate 112]

In the preparation of the patterned polarizing layer 01, a coating film of the composition for forming a polarizing layer was formed and then a pressing die having unevenness was pressed against the coating film (refer to FIG. 8). The pressing die has an uneven pattern in which the position of the convex portion corresponds to the position of the light emitting element (area ratio: 1%) of the EL substrate 3 described later.

In the state where the coating film was pressed by the pressing die, as in the preparation of the patterned polarizing layer 01, the coating film was heated, cooled, and further irradiated with light from a high pressure mercury lamp without using a mask to form a patterned polarizing layer 12.

Hereinafter, a polarizing plate 112 was prepared in the same manner as the preparation of the polarizing plate 101.

In addition, with respect to the formed patterned polarizing layer, the polarization degrees, the single transmittances (transmittances), and the area ratios of the regions A and B were calculated in the same manner as in the patterned polarizing layer 01. The polarization degree, the single transmittance (transmittance), and the area ratio are collectively shown in Table 1 below.

Regarding the regions A and B of the patterned polarizing layer 12 of the polarizing plate 112, in the vicinity of the boundary between the regions, the region A had a region in which the polarization degree gradually increased toward the region B, and the region B had a region in which the polarization degree gradually decreased toward the region A.

[Preparation of Polarizing Plate 113]

<Preparation of Coating Liquid A>

The following curable composition 2 was prepared, filtered through a polypropylene filter having a pore size of 0.2 μm, and dried under reduced pressure for 30 minutes to obtain a coating liquid A for forming a resin layer.

| Curable Composition 2 | |
|---|---|
| Dicyclopentanyl acrylate (FA-513AS (manufactured by Hitachi Chemical Co., Ltd.)) | 78.4 parts by mass |
| Tricyclodecane dimethanol diacrylate (A-DCP (manufactured by Shin-Nakamura Chemical Co., Ltd.)) | 20.0 parts by mass |
| Photopolymerization initiator (IRGACURE TPO (manufactured by BASF)) | 0.2 parts by mass |

<<Preparation of Base Material Having Uneven Structure>>

The coating liquid A for forming a resin layer was applied to the surface of the support, the uneven portion of the pressing die were transferred, and then the film was photocured to prepare a base material having an uneven structure.

The pressing die has an uneven pattern in which the position of the concave portion corresponds to the position of the light emitting element (area ratio: 1%) of the EL substrate 3. Accordingly, in this base material, the position of the convex portion corresponds to the position of the light emitting element of the EL substrate 3.

Further, for photocuring, the film was irradiated with 2000 $mJ/cm^2$ of ultraviolet rays from the support side using an air-cooling metal halide lamp of 160 W/cm (manufactured by EYE GRAPHICS Co., Ltd.) to cure the resin layer.

<<Preparation of Polarizing Plate 113>>

A polarizing plate 113 was prepared in the same manner as in the preparation of the polarizing plate 101 except that the composition for forming a polarizing layer was applied to the base material, and a mask was not used during irradiation with light emitted from the high pressure mercury lamp.

In addition, with respect to the formed patterned polarizing layer, the polarization degrees, the single transmittances (transmittances), and the area ratios of the regions A and B were calculated in the same manner as in the patterned polarizing layer 01. The polarization degree, the single transmittance (transmittance), and the area ratio are collectively shown in Table 1 below.

The regions A and B of the patterned polarizing layer 13 of the polarizing plate 113 were provided such that in the vicinity of the boundary between the regions, the region A had a region in which the polarization degree gradually increased toward the region B and in the region A, and the region AB had a region in which the polarization degree gradually decreased toward the region A, and a change in the polarization degree was smoother than that in the patterned polarizing layer 12.

TABLE 1

| | Patterned polarizing plate | | | | | |
|---|---|---|---|---|---|---|
| | Region A (corresponding to position of light emitting element) | | | Region B | | |
| | Polarization degree | Transmittance | Area ratio | Polarization degree | Transmittance | Area ratio |
| Polarizing plate 101 | 1% | 92% | 40% | 92% | 45% | 60% |
| Polarizing plate 102 | 1% | 92% | 40% | 85% | 47.4% | 60% |
| Polarizing plate 103 | 1% | 92% | 40% | 35% | 75% | 60% |

TABLE 1-continued

| | Patterned polarizing plate | | | | | |
|---|---|---|---|---|---|---|
| | Region A (corresponding to position of light emitting element) | | | Region B | | |
| | Polarization degree | Transmittance | Area ratio | Polarization degree | Transmittance | Area ratio |
| Polarizing plate 104 | 40% | 70% | 40% | 92% | 45% | 60% |
| Polarizing plate 105 | 75% | 48% | 40% | 92% | 45% | 60% |
| Polarizing plate 106 | 1% | 92% | 10% | 92% | 45% | 90% |
| Polarizing plate 107 | 1% | 92% | 55% | 92% | 45% | 45% |
| Polarizing plate 108 | 1% | 92% | 25% | 92% | 45% | 75% |
| Polarizing plate 109 | 1% | 92% | 16% | 92% | 45% | 84% |
| Polarizing plate 110 | 1% | 92% | 1.6% | 92% | 45% | 98% |
| Polarizing plate 111 | 1% | 92% | 22% | 92% | 45% | 78% |
| Polarizing plate 112 | 1% | 92% | 1.6% | 92% | 45% | 98% |
| Polarizing plate 113 | 1% | 92% | 1.6% | 92% | 45% | 98% |

[Preparation of λ/4 Phase Difference Film]

<Preparation of Composition for Photo Alignment Film>

The same composition as the composition for forming an alignment film used for forming the alignment film in the patterned polarizing layer 01 was prepared.

<Preparation of Coating Liquid for Optically Anisotropic Layer>

A coating liquid for an optically anisotropic layer having the following composition was prepared.

| Coating Liquid for Optically Anisotropic Layer | |
|---|---|
| Liquid crystal compound L-3 below | 42.00 parts by mass |
| Liquid crystal compound L-4 below | 42.00 parts by mass |
| Polymerizable compound A-1 below | 16.00 parts by mass |
| Low molecular weight compound B-2 below | 6.00 parts by mass |
| Polymerization initiator S-1 (oxime type) below | 0.50 parts by mass |
| Leveling agent G-1 below | 0.20 parts by mass |
| HISOLVE MTEM (manufactured by Toho Chemical Industry Co., Ltd.) | 2.00 parts by mass |
| NK ESTER A-200 (manufactured by Shin-Nakamura Chemical Co., Ltd.) | 1.00 mass part |
| Methyl ethyl keton | 424.8 parts by mass |

The group adjacent to the acryloyloxy group in the following liquid crystal compounds L-3 and L-4 represents a propylene group (a group in which a methyl group is substituted by an ethylene group), and each of the following liquid crystal compounds L-3 and L-4 represents a mixture of position isomers with different methyl group positions.

L-3

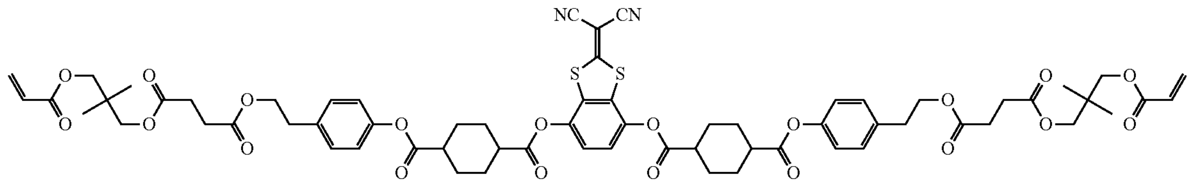

-continued

L-4

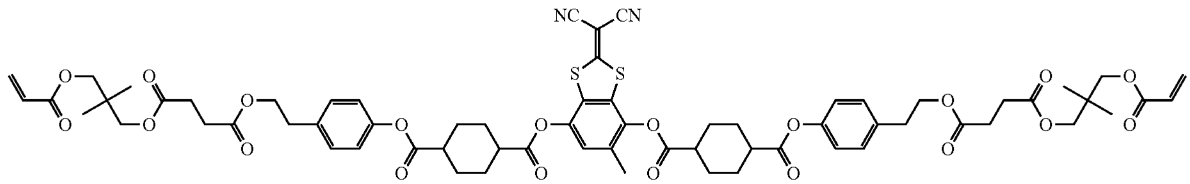

A-1

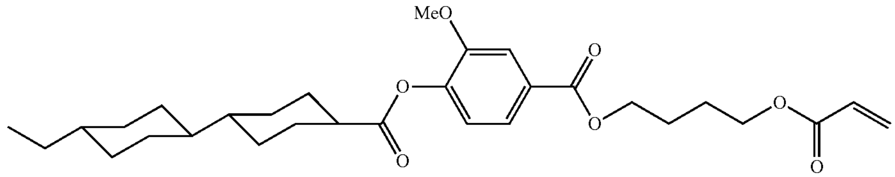

B2

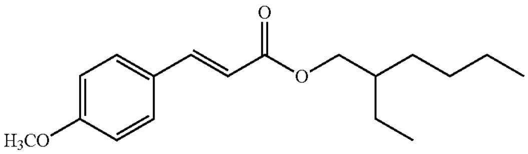

S-1

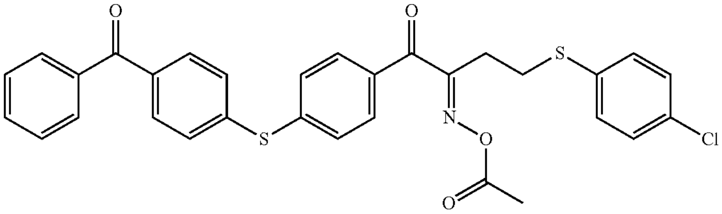

G-1

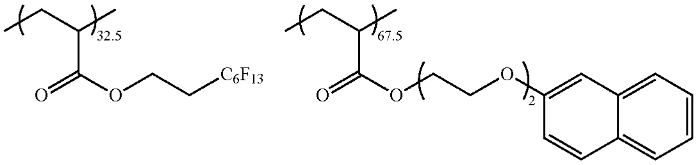

<Preparation of Cellulose Acylate Film>

(Preparation of Core Layer Cellulose Acylate Dope)

The following composition was put into a mixing tank and stirred to dissolve each component, and a cellulose acetate solution to be used as a core layer cellulose acylate dope was prepared.

| Core Layer Cellulose Acylate Dope | |
|---|---|
| Cellulose acetate having acetyl substitution degree of 2.88 | 100 parts by mass |
| Polyester compound B described in examples of JP2015-227955A | 12 parts by mass |
| Compound F below | 2 parts by mass |
| Methylene chloride (first solvent) | 430 parts by mass |
| Methanol (second solvent) | 64 parts by mass |

Compound F

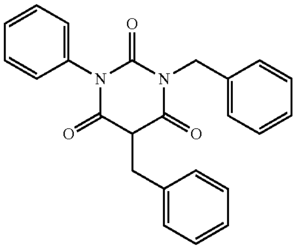 [SMILES: O=C1C(Cc2ccccc2)C(=O)N(c2ccccc2)C(=O)N1Cc1ccccc1]

(Preparation of Outer Layer Cellulose Acylate Dope)

10 parts by mass of the following matting agent solution was added to 90 parts by mass of the above-described core layer cellulose acylate dope to prepare a cellulose acetate solution to be used as an outer layer cellulose acylate dope.

| Matting agent solution | |
|---|---|
| Silica particles having average particle size of 20 nm (AEROSIL R972, manufactured by NIPPON AEROSIL CO., LTD.) | 2 parts by mass |
| Methylene chloride (first solvent) | 76 parts by mass |
| Methanol (second solvent) | 11 parts by mass |
| Core layer cellulose acylate dope above | 1 part by mass |

(Preparation of Cellulose Acylate Film 1)

The core layer cellulose acylate dope and the outer layer cellulose acylate dope were filtered with filter paper having an average pore size of 34 μm and a sintered metallic filter having an average pore size of 10 μm, and then the three layers of the core layer cellulose acylate dope and the outer layer cellulose acylate dopes on both sides of the core layer cellulose acylate dope were simultaneously cast on a drum at 20° C. from a casting port (band casting machine).

Next, the film was peeled off in a state in which the solvent content was about 20% by mass, and both ends of the film in a width direction were fixed by a tenter clip. The film was dried while being stretched in a transverse direction at a stretching ratio of 1.1.

Then, the film was further dried by being transported between rolls of a heat treatment device, and a cellulose acylate film 1 having a thickness of 40 μm was prepared. The in-plane retardation of the obtained cellulose acylate film 1 was 0 nm.

<Preparation of λ/4 Phase Difference Film>

Each photo alignment film composition prepared was applied to one surface of the prepared cellulose acylate film 1 using a bar coater.

After the application, the solvent was removed by drying on a hot plate at 120° C. for 1 minute, and a composition layer having a thickness of 0.3 μm was formed. The obtained composition layer was irradiated with polarized ultraviolet rays (10 $mJ/cm^2$, using an ultra high pressure mercury lamp) to form a photo alignment film.

Next, the coating liquid for an optically anisotropic layer prepared was applied to the photo alignment film using a bar coater to form a composition layer. The formed composition layer was heated to 110° C. once on a hot plate, and then cooled to 60° C. to stabilize the alignment.

Thereafter, the temperature was kept to 60° C., and the alignment was fixed by irradiation with ultraviolet rays (500 $mJ/cm^2$, using an ultra high pressure mercury lamp) under a nitrogen atmosphere (oxygen concentration: 100 ppm) to form an optically anisotropic layer having a thickness of 2.3 μm, and a λ/4 phase difference film was prepared. The in-plane retardation of the obtained optical laminate was 140 nm.

[Preparation of Positive C-Plate Film]

As a temporary support, a commercially available triacetyl cellulose film "Z-TAC" (manufactured by Fujifilm Corporation) was used (this is referred to as a cellulose acylate film 2).

A film surface temperature of the cellulose acylate film 2 was increased to 40° C. by allowing the film to pass through a dielectric heating roll at a temperature of 60° C., and then an alkaline solution having the following composition was applied to one side of the film at a coating amount of 14 $ml/m^2$ using a bar coater, heated to 110° C., and transported for 10 seconds under a steam type far-infrared heater manufactured by NORITAKE CO., LIMITED.

Next, pure water was applied using the same bar coater at 3 $ml/m^2$.

Next, water washing by a fountain coater and draining by an air knife were repeated three times, and then the film was transported to a drying zone at 70° C. for 10 seconds and dried to prepare an alkali-saponified cellulose acylate film 2.

| Composition of Alkaline Solution (parts by mass) | |
|---|---|
| Potassium hydroxide | 4.7 parts by mass |
| Water | 15.8 parts by mass |
| Isopropanol | 63.7 parts by mass |
| Fluorine-containing surfactant SF-1 ($C_{14}H_{29}O(CH_2CH_{20})_{20}H$) | 1.0 part by mass |
| Propylene glycol | 14.8 parts by mass |

The above alkali-saponified cellulose acylate film 2 was used, and a coating liquid for forming an alignment film having the following composition was continuously applied thereto using a #8 wire bar. The liquid was dried for 60 seconds by hot air at 60° C., and further dried for 120 seconds by hot air at 100° C. to form an alignment film.

| Composition of Coating Liquid for Forming Alignment Film | |
|---|---|
| Polyvinyl alcohol (PVA 103 manufactured by KURARAY CO., LTD.) | 2.4 parts by mass |
| Isopropyl alcohol | 1.6 parts by mass |
| Methanol | 36 parts by mass |
| Water | 60 parts by mass |

The following coating liquid N was applied to the cellulose acylate film 2 having the alignment film prepared as described above. After aging for 60 seconds at 60° C., the film was irradiated with 1000 $mJ/cm^2$ of ultraviolet rays using an air-cooling metal halide lamp (manufactured by EYE GRAPHICS Co., Ltd.) of 70 $mW/cm^2$ in the air to fix the alignment state. Thus, the polymerizable rod-like liquid crystal compound was vertically aligned, and a positive C-plate film 2 was prepared. The Rth of the prepared positive C-plate film at a wavelength of 550 nm was −60 nm.

| Composition of Coating Liquid N | |
|---|---|
| Liquid crystal compound L-1 below | 80 parts by mass |
| Liquid crystal compound L-2 below | 20 parts by mass |
| Vertical alignment agent (S01) below | 1 part by mass |
| Ethylene oxide modified trimethylolpropane triacrylate (V #360, manufactured by Osaka Organic Chemical Industry Ltd.) | 8 parts by mass |
| IRGACURE 907 (manufactured by BASF SE) | 3 parts by mass |
| KAYACURE DETX (manufactured by Nippon Kayaku Co., Ltd.) | 1 part by mass |
| Compound B03 below | 0.4 parts by mass |

-continued

| | |
|---|---|
| Methyl ethyl ketone | 170 parts by mass |
| Cyclohexanone | 30 parts by mass |

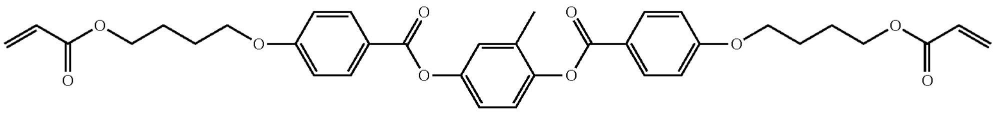

L-1

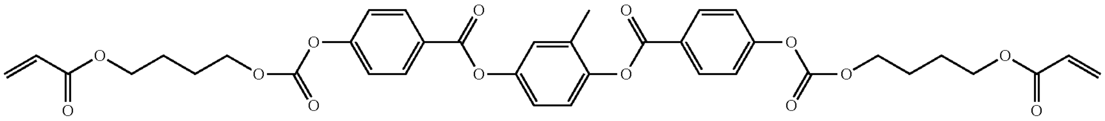

L-2

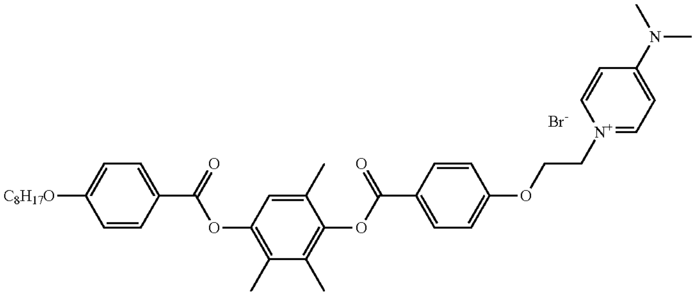

S01

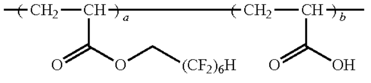

<Preparation of Circularly Polarizing Plate>

The positive C-plate film prepared above was transferred to the optically anisotropic layer side of the λ/4 phase difference film via a pressure sensitive adhesive and the cellulose acylate film 2 was removed. Further, the polarizing plates 101 to 113 and the polarizing plate 201 prepared in advance were laminated on the cellulose acylate film 1 side of the λ/4 phase difference film via a pressure sensitive adhesive, respectively, and 14 kinds of circularly polarizing plates were obtained.

Example 1

As the EL substrate 1, an LED display (LAVENDER manufactured by SiliconCore Technology, LLC., pitch of light emitting elements: 1.2 mm) was prepared. The area ratio of the light emitting elements in this EL substrate 1 is 25%.

On this EL substrate, the circularly polarizing plate having the polarizing plate 101 was arranged so that the positive C-plate side became the EL substrate 1 side, and a surface film (CV-LC5 manufactured by Fujifilm Corporation) was laminated on the λ/4 phase difference film side via a pressure sensitive adhesive to prepare a (EL) display device 11 of Example 1.

In a case of arrangement, the position of the region A (the region having a low polarization degree) of the circularly polarizing plate prepared and the position of the light emitting element of the EL substrate 1 were aligned so as to correspond to each other. In addition, the distance between the patterned polarizing layer and the upper surface of the light emitting element was 1 mm.

Examples 2 to 6 and 11, and Comparative Examples 1 and 2

Display devices 12 to 18 of Examples 2 to 6 and 11 and Comparative Example 1 were prepared in the same manner as in Example 1 except that the circularly polarizing plates having the polarizing plates 102 to 108 were used.

Further, as Comparative Example 2, a display device 27 was prepared in such a manner that, in a case where the circularly polarizing plate was arranged on the EL substrate in Example 1, the position of the region A of the circularly polarizing plate did not correspond to the position of the light emitting element of the EL substrate 1.

Example 7

Three-color light emitting LEDs (PICOLED model number: SMLP34RGB, manufactured by ROHM Co., Ltd.) were arranged on a printed substrate in a two-dimensional grid pattern so that the area ratio of the LEDs (light emitting elements) was 10%. In a portion in which the LED was not arranged, a black layer formed of a black matrix material for a liquid crystal display device was formed using photolithography. Thus, an EL substrate 2 was prepared (refer to FIG. 4).

A display device 19 of Example 7 was prepared by arranging the circularly polarizing plate having the patterned polarizing layer 109 and the surface film on the EL substrate 2 in the same manner as in Example 1.

Example 8

An EL substrate 3 was prepared in the same manner as the EL substrate 2 except that the three-color light emitting LEDs were arranged so that the pixel occupation rate becomes 1%.

A display device 20 of Example 8 was prepared by arranging the circularly polarizing plate having the patterned polarizing layer 110 and the surface film on the EL substrate 3 in the same manner as in Example 1.

Example 9

A display device 21 of Example 9 was prepared in the same manner as in Example 8 except that the distance between the patterned polarizing layer and the light emitting element was 0.2 mm.

Example 10

An organic EL display device (V30, manufactured by LG Electronics Corp.) equipped with an organic EL substrate (organic EL panel) was disassembled, a touch panel with a circularly polarizing plate was peeled from the organic EL display device, and further, the circularly polarizing plate was peeled from the touch panel. The organic EL substrate, the touch panel, and the circularly polarizing plate were isolated.

Next, the isolated touch panel and organic EL display element were laminated again to form an EL substrate 4 (refer to FIG. 2).

The circularly polarizing plate having the polarizing plate 111 and the surface film were arranged on the EL substrate 4 in the same manner as in Example 1 to prepare a display device 22 of Example 10. The distance between the patterned polarizing layer and the upper surface of the light emitting element was 0.25 mm.

[Measurement of Utilization Efficiency of Light of Light Emitting Element]

Using a spectral luminance meter (SR3, manufactured by Topcon Techno House Corporation), the brightness was measured at a distance of 700 mm from the display surface of the prepared display device to measure the utilization efficiency of light (light utilization efficiency) of the light emitting element.

In order to measure the utilization efficiency of light of the light emitting element, a display device 00 using the circularly polarizing plate having the polarizing plate 201 without the pattern of the polarizing layer 90 instead of the circularly polarizing plates of Examples and Comparative Examples was prepared.

The utilization efficiency of light of the light emitting element of each display device of Examples and Comparative Examples was measured by the brightness of each display device of Examples and Comparative Examples with respect to the brightness of the display device 00.

The brightness for the display device 00 was evaluated as

A in a case where the brightness is 2.1 times or more,

B in a case where the brightness is 1.8 times or more and less than 2.1 times,

B− in a case where the brightness is 1.5 times or more and less than 1.8 times,

C in a case where the brightness is 1.0 or more and less than 1.5 times, and

D in a case where the brightness is less than 1.0 times.

[Measurement of Reflectivity]

The Y value in the SCI measurement method was measured 10 times by changing the position in the plane using a spectrocolorimeter (CM2022 manufactured by Konica Minolta Opto, Inc.), and the average value was used as the reflectivity.

The results are shown in Table 2 below.

TABLE 2

| | Display device | EL substrate | Light emitting element Area ratio (SP) | Polarizing plate | Region A Area ratio (SP) | SA/SP | Light utilization efficiency | Reflectivity |
| --- | --- | --- | --- | --- | --- | --- | --- | --- |
| Example 1 | Display device 11 | EL substrate 1 | 25% | Polarizing plate 101 | 40% | 1.6 | B | 4.5% |
| Example 2 | Display device 12 | EL substrate 1 | 25% | Polarizing plate 102 | 40% | 1.6 | B | 4.6% |
| Comparative Example 1 | Display device 13 | EL substrate 1 | 25% | Polarizing plate 103 | 40% | 1.6 | B | 6.1% |
| Example 3 | Display device 14 | EL substrate 1 | 25% | Polarizing plate 104 | 40% | 1.6 | B− | 3.5% |
| Example 4 | Display device 16 | EL substrate 1 | 25% | Polarizing plate 106 | 10% | 0.4 | C | 2.6% |
| Example 5 | Display device 17 | EL substrate 1 | 25% | Polarizing plate 107 | 55% | 2.2 | B | 5.1% |
| Example 6 | Display device 18 | EL substrate 1 | 25% | Polarizing plate 108 | 25% | 1 | B | 3.9% |
| Example 7 | Display device 19 | EL substrate 2 | 10% | Polarizing plate 109 | 16% | 1.6 | B | 2.9% |
| Example 8 | Display device 20 | EL substrate 3 | 1% | Polarizing plate 110 | 1.6% | 1.6 | B | 1.9% |
| Example 9 | Display device 21 | EL substrate 3 | 1% | Polarizing plate 110 | 1.6% | 1.6 | A | 1.9% |
| Example 10 | Display device 22 | EL substrate 4 | 13.9% | Polarizing plate 111 | 22% | 1.6 | A | 3.3% |
| Example 11 | Display device 15 | EL substrate 1 | 25% | Polarizing plate 105 | 40% | 1.6 | C | 2.9% |
| Comparative Example 2 | Display device 27 | EL substrate 1 | 25% | Polarizing plate 101 | 40% | 1.6 | D | 3.5% |

In the EL substrate 4 (OLED) of Example 10, the area ratio of the light emitting elements is 3.3% for the R light emitting element, 5.8% for the G light emitting element, and 4.7% for the B light emitting element. In Example 10, correspondingly, regarding the area ratio of the region A, the area ratio of the region corresponding to the R light emitting element is 5.3%, the area ratio of the region corresponding to the G light emitting element is 9.3%, and the area ratio of the region corresponding to the B light emitting element is 7.5%.

As shown in Table 2, in the display device according to the embodiment of the present invention, both the utilization efficiency of light (light utilization efficiency) of the light emitting element and the function of preventing reflection of external light can be obtained.

In addition, as shown in Examples 4, 5, 1, and the like, by setting the ratio (SA/SP) of the area ratio SA of the region A to the area ratio SP of the light emitting elements to 0.5 or more, and setting the area ratio of the region A to 50% or less (SA<50%), it is possible to more suitably achieve both the utilization efficiency and the function of preventing reflection of external light.

Further, as shown in Examples 8 to 10, by setting the area ratio of the light emitting elements to 10% or less, it is possible to more suitably achieve both the utilization efficiency and the function of preventing reflection of external light.

On the other hand, in Comparative Example 1 using the polarizing plate 103 having a polarization degree of 75% in the region B of the patterned polarizing layer, a function of preventing reflection of external light cannot be sufficiently obtained. In addition, in Comparative Example 2 in which the position of the region A does not correspond to the position of the light emitting element, the utilization efficiency of light emitted from the light emitting element is low.

Examples 12 and 13

A display device 23 was prepared in the same manner as in Example 1 except that the distance between the patterned polarizing layer and the light emitting element of the EL substrate 1 was 2 mm (Example 12).

A display device 24 was prepared in the same manner as in Example 1 except that the distance between the patterned polarizing layer and the light emitting element of the EL substrate 1 was 0.1 mm (Example 13).

As described above, the pitch of the light emitting elements of the EL substrate 1 used in the display device of Example 1 is 1.2 mm.

With respect to the prepared display devices, the utilization efficiency of light of the light emitting element and the reflectivity were measured in the same manner as above. The results are shown in Table 3 below. The results of Example 1 are also shown in the measurement results.

TABLE 3

| | Display device | EL substrate | Polarizing plate | Distance between polarizing layer and light emitting element | Light utilization efficiency | Reflectivity |
|---|---|---|---|---|---|---|
| Example 1 | Display device 11 | EL substrate 1 | Polarizing plate 101 | 1 mm | B | 4.5% |
| Example 12 | Display device 23 | EL substrate 1 | Polarizing plate 101 | 2 mm | B− | 4.5% |
| Example 13 | Display device 24 | EL substrate 1 | Polarizing plate 101 | 0.1 mm | A | 4.5% |

The pitch of the light emitting elements of the EL substrate 1 is 1.2 mm.

As shown in Table 3, by making the distance between the patterned polarizing layer and the light emitting elements of the EL substrate shorter than the pitch of the light emitting elements of the EL substrate, the utilization efficiency of light emitted by the light emitting elements can be further improved.

Examples 14 and 15

A display device was prepared in the same manner as in Example 8 except that the circularly polarizing plate having the polarizing plate 112 was used (Example 14).

A display device was prepared in the same manner as in Example 8 except that the circularly polarizing plate having the polarizing plate 113 was used (Example 15).

As described above, in the patterned polarizing layers of the polarizing plate 112 and the polarizing plate 113, the regions A and B are provided such that in the vicinity of the boundary between the regions, the region A has a region in which the polarization degree gradually increase toward the region B, the region B has a region in which the polarization degree gradually decrease toward the region A, and the change in the patterned polarizing layer of the polarizing plate 113 is smoother.

With respect to the prepared display devices, the utilization efficiency of light of the light emitting element and the reflectivity were measured in the same manner as above.

Further, regarding the example, the ease of aligning the EL substrate 3 (area ratio of light emitting elements:1%) and the circularly polarizing plate (patterned polarizing layer) was also evaluated.

The ease of alignment (alignment) was evaluated based on the rate of decrease in light utilization efficiency with respect to a case where the position is not shifted in arranging the circularly polarizing plate on the EL substrate by setting the diameter of a circle inscribed on the light emitting element as the size of the light emitting element, and shifting the position by 50% of the size of the light emitting element.

The decrease in light utilization efficiency was evaluated as

A in a case where the decrease was less than 5%,

B+ in a case where the decrease was 5% or more and less than 10%,

B in a case where the decrease was 10% or more and less than 20%,

C in a case where the decrease was 20% or more and less than 30%, and

D in a case where the decrease was 30% or more.

The results are shown in Table 4 below. The results of Example 8 are also shown in the measurement results.

TABLE 4

| | Display device | EL substrate | Polarizing plate | Change in polarization degree of region A and region B | Light utilization efficiency | Reflectivity | Alignment |
|---|---|---|---|---|---|---|---|
| Example 8 | Display device 20 | EL substrate 3 | Polarizing plate 110 | No change | B | 1.9% | B |
| Example 14 | Display device 25 | EL substrate 3 | Polarizing plate 112 | Changed | B | 1.9% | B+ |
| Example 15 | Display device 26 | EL substrate 3 | Polarizing plate 113 | Changed | B | 2.0% | A |

As shown in Table 4, the regions A and B of the patterned polarizing layer are provided such that in the vicinity of the boundary between the regions, the region A has a region in which the polarization degree gradually increases toward the region B, and the region AB has a region in which the polarization degree gradually decreases toward the region A. Thus, the alignment of the light emitting element of the EL substrate and the region A can be easily performed. Further, in this display device, a change in brightness from the front in a case where the display screen was visually observed from an oblique visual field was small and satisfactory.

From the above results, the effects of the present invention are clear.

INDUSTRIAL APPLICABILITY

The present invention can be suitably used for various display devices.

EXPLANATION OF REFERENCES

10: electroluminescent (EL) display device
12: EL substrate
12R: R light emitting element
12G: G light emitting element
12B: B light emitting element
14: λ/4 wavelength plate
16: support
18: patterned polarizing layer
18A, 18B: region
20: polarizing plate
24: light emitting unit
28: mask
28*a*: light shielding part
28*b*: light transmission part
30, 36: pressing die
34: base material
34F, F: coating film

What is claimed is:

1. An electroluminescent display device comprising, in order:

an electroluminescent substrate having a plurality of light emitting elements using electroluminescence;

a λ/4 wavelength plate; and a polarizing plate including a patterned polarizing layer, wherein the patterned polarizing layer has a region A having a polarization degree of less than 80% and a region B having a polarization degree of 80% or more, and further, a position of the region A of the patterned polarizing layer corresponds to a position of the light emitting element of the electroluminescent substrate, and wherein the patterned polarizing layer has at least one of the region A having a region with a high polarization degree in comparison with a region spaced from the region B on the region B side, or the region B having a region with a low polarization degree in comparison with a region spaced from the region A on the region A side.

2. The electroluminescent display device according to claim 1, wherein the region A of the patterned polarizing layer has a region having a polarization degree of 10% or less.

3. The electroluminescent display device according to claim 1, wherein a single transmittance of the region A of the patterned polarizing layer is 50% or more.

4. The electroluminescent display device according to claim 1, wherein in a case where an area ratio of the region A on the patterned polarizing layer is SA and an area ratio of the light emitting elements on the electroluminescent substrate is SP, $$0.5 \le SA/SP \text{ and } SA < 50\% \text{ are satisfied.}$$

5. The electroluminescent display device according to claim 1, wherein the area ratio of the light emitting elements on the electroluminescent substrate is 30% or less.

6. The electroluminescent display device according to claim 1, wherein the patterned polarizing layer is formed using a liquid crystal compound.

7. The electroluminescent display device according to claim 1, wherein a distance between the patterned polarizing layer and the light emitting elements on the electroluminescent substrate is shorter than a pitch of the light emitting elements on the electroluminescent substrate.

8. The electroluminescent display device according to claim 1, wherein the patterned polarizing layer has at least one of the region A having a region in which a polarization degree gradually increases toward the region B on the region B side, or the region B having a region in which a polarization degree gradually decreases toward the region A on the region A side.

9. The electroluminescent display device according to claim 1, wherein a total thickness of the polarizing plate and the λ/4 wavelength plate is 20 μm or less.

10. The electroluminescent display device according to claim 1, wherein the light emitting element is an LED.

* * * * *